US006852578B2

(12) United States Patent
Chang

(10) Patent No.: US 6,852,578 B2
(45) Date of Patent: Feb. 8, 2005

(54) SCHOTTKY DIODE STATIC RANDOM ACCESS MEMORY (DSRAM) DEVICE, A METHOD FOR MAKING SAME, AND CFET BASED DTL

(76) Inventor: Augustine Wei-Chun Chang, 2329 Rupert Drive Dr., San Jose Santa Clara, CA (US) 95124

( * ) Notice: Subject to any disclaimer, the term of this patent is extended or adjusted under 35 U.S.C. 154(b) by 0 days.

(21) Appl. No.: 10/346,502

(22) Filed: Jan. 15, 2003

(65) Prior Publication Data

US 2003/0147275 A1 Aug. 7, 2003

Related U.S. Application Data

(62) Division of application No. 09/882,617, filed on Jun. 15, 2001, now Pat. No. 6,590,800.

(51) Int. Cl.[7] .............................................. H01L 21/338
(52) U.S. Cl. ........................ 438/167; 257/256; 257/473
(58) Field of Search ................................ 257/256, 260, 257/473, 476; 438/322, 328, 167

(56) References Cited

U.S. PATENT DOCUMENTS

| 5,163,022 A | | 11/1992 | Homma et al. ............. 365/190 |
|---|---|---|---|
| 5,177,584 A | * | 1/1993 | Uchida et al. .............. 257/477 |
| 5,276,638 A | | 1/1994 | Wong .......................... 365/156 |
| 5,915,179 A | * | 6/1999 | Etou et al. .................. 438/268 |
| 6,353,251 B1 | * | 3/2002 | Kimura ....................... 257/473 |

* cited by examiner

*Primary Examiner*—Anh Phung
*Assistant Examiner*—Christian D. Wilson
(74) *Attorney, Agent, or Firm*—Sawyer Law Group LLP

(57) ABSTRACT

A high speed, low power Static Random Access Memory (SRAM) Array, which includes a 4T cell with two integrated Schottky Barrier Diodes (SBD) is provided. In a preferred embodiment, the cell bulk area and speed advantage is 30%, and AC power saving is 75% compared with the 6T CFET cell. The physical construct of the 4T cell saves capacitance in all critical nodes intra or inter cell wise, eliminates pass transistors, reduces the well noises. Typical embodiment uses a 0.15-um-rule based layout, and 1.5V supports operation at 5 ns cycles. SBD are used extensively with CFET to form a CMOS version of the Diode Transistor Logic circuitry. Generic control functions can be implemented including NAND/NOR gates, level shifting, decoding, voltage generator, ESD and latch-up protection, leakage control, and dynamic VT setting while in operation. Product applications include DRAM, SRAM, PLD, DRAM, CAM, Flash, Computing, Networking, and Communication devices as standalone system component or embedded into any ASIC.

7 Claims, 17 Drawing Sheets

Vertical cross-section schematics of the SBD-NFET pair.

Conventional SRAM using No pull up.

Conventional SRAM using thin film resistor pull-up.

Conventional SRAM using Thin Film FET

Conventional SRAM using bulk CFET FET

DSRAM, Twin Word Line Cell (TWLC), schematics

DSRAM typical layout

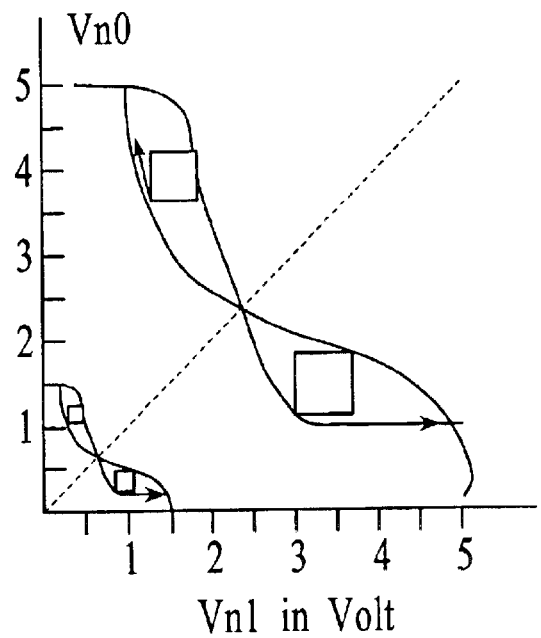
Latch node switching loops at various power supplies from 5 V to 1.5 V range
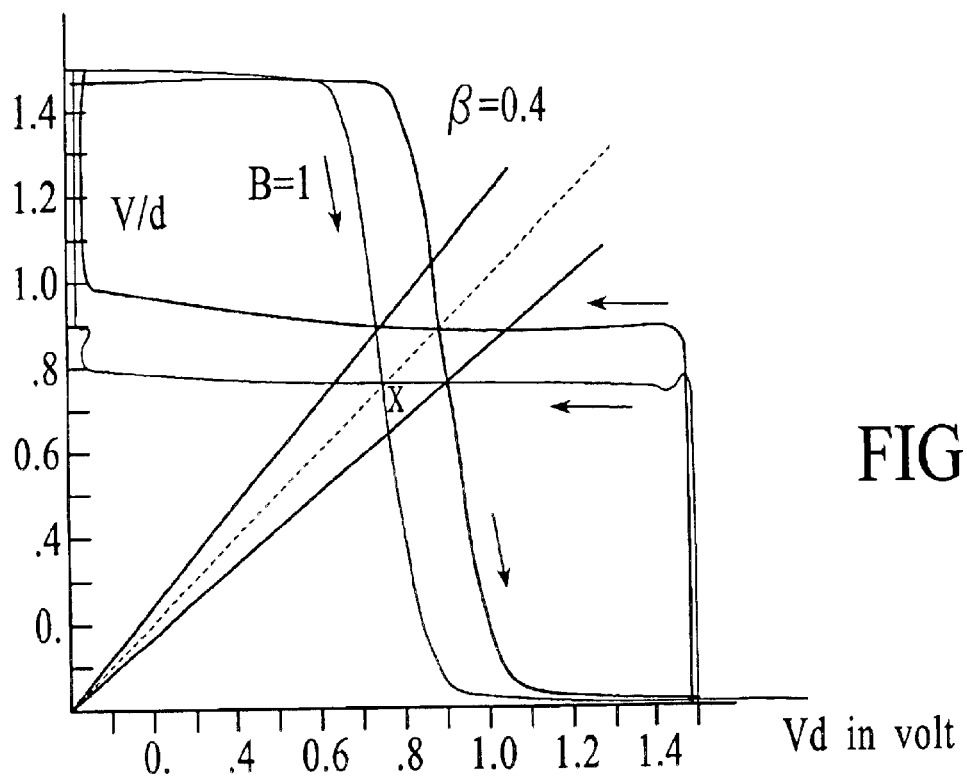
Lower beta cell ratio gain additional noise margin for the DSRAM cell Family of SDB I-V curves using various barrier metals at from Temp=-30, 27, 85 oC, TiW has VT=0.35 V @ 1 uA, Pt has VT=0.7 V, Impedance ~ 1.5k Ω for I<100 uA, 150 Ω for I<1 ma SBD size effect; I-V curves TiW at room temp. The SBD1 has area of .5x.5 um, SBD2 uses .18x.18 um, Rc effect is excluded here. SBD1 can be an efficient clamp diode.

Typical Nch FET I-V curves, VT=0.7 V, Gox=100A. IDS is about 4 uA, 55 uA at VGS=0.9 and 1.5 V respectively. Linear resistance is about Rmin = 7K ohm.

Word Line driver schematics for the DSRAM™ cell, using SBD for level shift

Column Pre-charge driver and bit-line bus recovery circuitry of the DSRAM™ cell arrays The dual logic circuit of the decoder of Fig. 12

DSRAM™ sub-array cell layout partial views

DSRAM™ sub-array cell layout partial views
(device and node ID drawing)

Word decoder for the DSRAM™ cell array
using CDTL™ decoding and CFET Totem

TM

Vertical cross-section schematics of the SBD-NFET pair.

The horizontal layout view.

200 DSRAM™ cell device vertical cross-section and SCFET process description

The 4-T DSRAM™ Implementation with SOI using Junction Diode with NFET, Vertical cross-section view.

4-T DSRAM™ implementation with SOI using Junction Diode with PFET, Vertical cross-section view.

In Silicon On Insulator technology, the Junction diode may be used in lieu of SBD. Two circuit configurations are proposed. The P-N diodes may be integrated with either NFET or PFET devices.

Parasitic PNPN latch-up circuit model of the unprotected CFET transistors

The shallow oxide or LOCOS isolation fix for latch up
prevention scheme by tapping the wells frequently.

Properly placed SBD may suppress the parasitic NPN and PNP action thus eliminate sources to latch-up. This circuit configuration may also forward bias the wells and lowering Vtn or Vtp.

WLW driver NFET (T9) having dynamic Vtn.

SBD for input ESD protections.

Layout comparison of the 4T DSRAM™ and the conventional 6T SRAM cells.

SCHOTTKY DIODE STATIC RANDOM ACCESS MEMORY (DSRAM) DEVICE, A METHOD FOR MAKING SAME, AND CFET BASED DTL

This application is a division of Ser. No. 09/882,617 filed Jun. 15, 2001, now U.S. Pat. No. 6,590,800.

FIELD OF THE INVENTION

The present invention relates generally to memory devices and in particular to the circuit design, device design, and processing technology of the high speed, high density, and low power physical constructs for memory cores, IO data buffer arrays, and control blocks.

BACKGROUND OF THE INVENTION

Conventional high speed and low power buffer storage systems have evolved over time. FIG. 1 illustrates a first generation buffer storage system 10. There are 2 NFET pass transistors and 2 CFET, which formed a latch. The system 10 uses no pull-up transistors for the latch portion of the cell. The problem with this type of system is that it was slow and unreliable to hold information. FIG. 2 is a second-generation buffer storage system 30. In this system 30 the SRAM cell using high value resistor pull up. The resistor consumes DC current, and is slow when a large array capacity is involved. As the density gets higher, it consumes large DC current and the circuit is slow. FIG. 3 is a third generation buffer storage system 50 which uses thin-film Poly PFET (TFT) as active pull-ups. The TFT is attractive as the PFET and intra circuit connecting stacked in vertical space, hence the cell elements overlaps in the horizontal dimension yielding smallest bulk area. But like its predecessors, it is also slow, and suffers from leakage. FIG. 4 is the latest generation of conventional buffer storage systems 70. The system 70 uses 2 bulk PFET as pull-up in the latch portion of the cell. The problems with this type of system are large cell area, and it is difficult to scale down in operating voltage because of fixed high VT in the CFET.

The more recent configuration uses the topology of 6 transistor cell. All of them are in the Si bulk. The cell size is bulky, but it has been successfully implemented with the latest CFET 0.15 um technology as photolithographic rules for layout.

It is important to realize that the IC cost is closely related to the horizontal cell size as one wishes fit more dice in a wafer. The cell pitches in each cell dimensions are related to the length of the bit lines and word lines hence to the array sizes. The capacitances associated with every main circuit element intra and/or inter cell wise play an important role in speed considerations, and the noise margins are often compromised by the designers with speed in conjunction with the dc/ac power consumptions in the determination of Vcc supply, and signal and acceptable noise levels.

Accordingly, what is needed is a buffer storage system, which overcomes the above-identified problems. The present invention addresses such a need.

SUMMARY OF THE INVENTION

An improved buffer storage cell configuration is disclosed. The buffer storage cell comprises four (4) CFET and two (2) Schottky diodes. It is suitable for voltage and physical scale-down and is inherently superior to the conventional six transistor (6T) SRAM cell. This device can be utilized to minimize area and power, increase speed and improve reliability.

The cell can be a basic circuit element to form a core or can be utilized in arrays for various applications. The cell can be a standalone memory product or can be mixed with other products in the System On a Chip (SOC) environment. Applicable categories of commercial products include but are not limited to SRAM, DRAM, Flash, CAM, PLD and ASIC controllers or micro-processors.

A cell configuration in accordance with the present invention is compatible with existing CFET/BiCFET, GaAs, or SiGe processes, which means it has the least entrance barrier for its acceptance by the foundries and to the system users. The 2-Diode and 4 CFET FET structure can be extended to include a PN junction diode where the device is totally insulated without utilizing biasing wells.

A system and method in accordance with the present invention provides for an efficient solution for data storage and access. The constructs can be in the form of standard IC commodities of any organization, which contains the arrays employing the cells and/or techniques in accordance with the present invention.

Still other fields of possible functional uses include but not limited to the buffer units of all main stream emerging IC products in digital telecommunication equipment, wire or wireless Telephony devices, CPU and disk cache, Digital Signal Processors (DSP). It can be used in CFET, BiCFET, GaAs, or SiGe processes or any compatible technology.

The means of providing various cost-performance memory solutions are many. For any system, the speed grade ranges from low to high are, Disk devices with search time in mS, Flash device read/write in uS, DRAM in 50 nS, and SRAM in near ns, 16 Mb of ×16 configuration, i.e. 1M×16, in 2–5 nS. It is always critical to provide options to a system designer with the basic memory cell and organizations of various high speed, low area, and low power to fit ones system unit application. In the digital RAM domain of semiconductor devices including DRAM, Flash, and SRAM, the trend is to scale down the physical size of the cells on chip, operating voltage and currents are less for each generation of advanced solutions.

A more efficient circuit means has been proposed as viable approach to implement control logics with Diode Transistor Logic. Previously in the 1980s, DTL was once the backbone technology in Bipolar transistors. This invention teaches concepts to realize control functions and levels by various CFET and SBD configurations in additional to Buffer cell applications. Therefore is cost-performance attractive as a generic logic and memory tool-box suitable for any SOC applications. This design approach, using pulsed diode decoding and CFET inverter for NAND gates, takes less area, more stable load curve, and faster than CFET designs.

BRIEF DESCRIPTION OF THE DRAWINGS

FIG. 7 illustrates the concept of the latch operations and state transition traces.

FIG. 8 shows that the latch can hold more or less stable by decreasing or increasing the width ratio wp/wn under the formula □=(1/2.5)*wp/wn in the cell.

FIGS. 11–14 show some of the circuit constructs, which serve as generic examples of a set of control circuitries to form a Diode-CFET-Transistor-Logic CDTL™ circuit library with the invented DCFET™ technology supporting the DSRAM for its various functions.

FIG. 11 shows the Twin World Line Driver.

FIG. 12 shows the pre-charge control circuitry, which uses N-FET Totem pole for a level shift generator, to switch the bit-line buses 1910. It also shows sub-groups of DSRAM™ Scells 1906 sharing common resources. The decoder logic is of CDTL™ instead of conventional CFET NAND.

FIG. 12-1 shows one of the decoding circuit variation of FIG. 12.

FIG. 13 is the diode decoder version of the DSRAM decoder using CFET totem pole.

FIG. 13-1 shows DCFET™ Totem pole level adjustments with various circuit configurations.

FIG. 16 cites an embodiment applying the most aggressive implementation with the Silicon On Insulator (SOI) scheme.

DETAILED DESCRIPTION

The present invention relates generally to memory devices and in particular to the circuit design, device design, and processing technology of the high speed, high density, and low power physical constructs for memory cores, IO data buffer arrays, and control blocks.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 5:
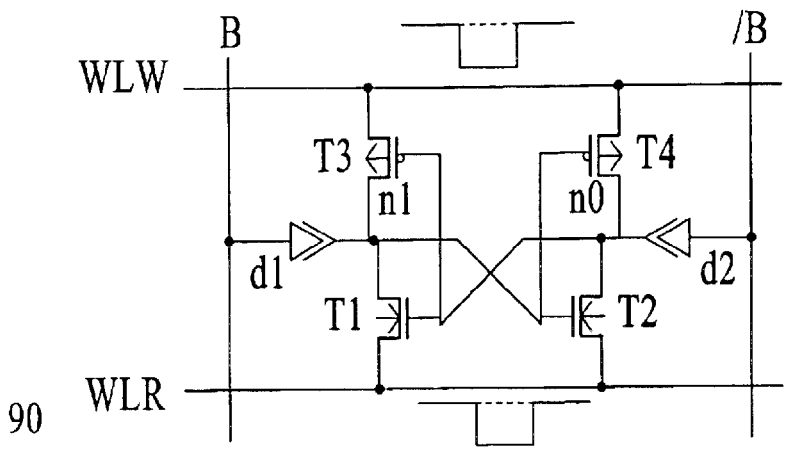
FIG. 5 is a storage buffer system in accordance with the present invention.
Figure 6:
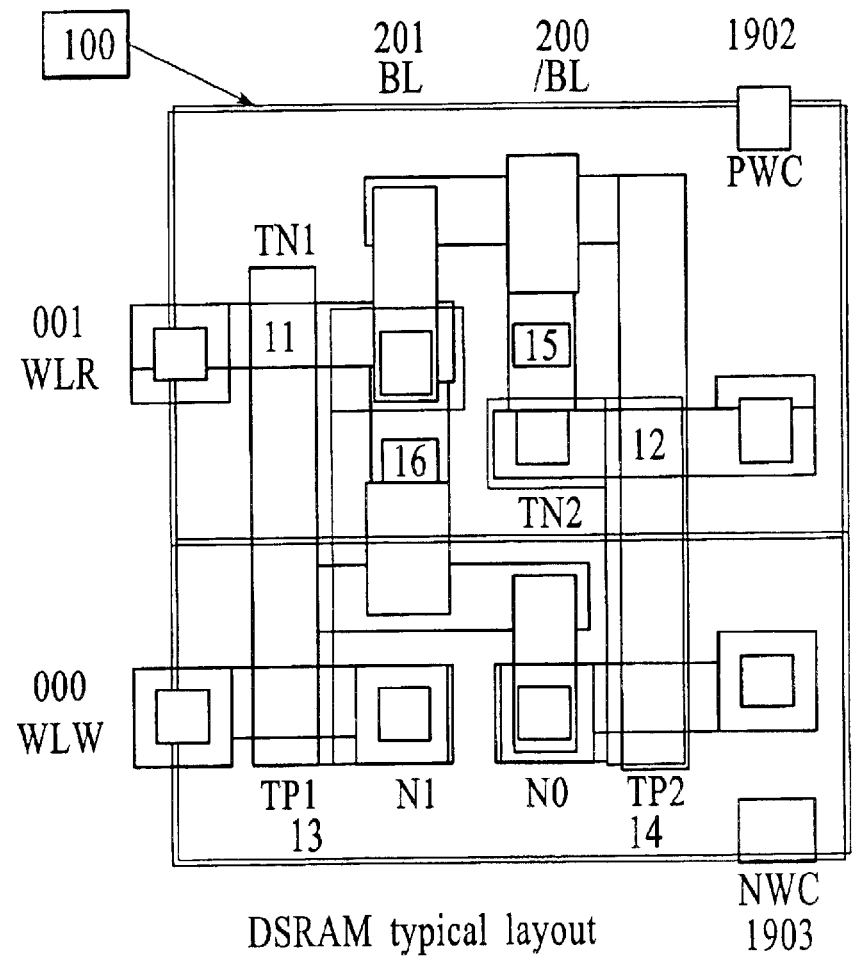
FIG. 6 is the top view of the layout of FIG. 1 circuit implementation.

A high speed Static Random Access Memory Array which includes a 4-T cell and two Schottky Barrier Diodes (SBD) is disclosed (FIGS. 5 and 6). In a preferred embodiment, the cell bulk area/speed advantage is 30%, and AC power saving is 75% better than the 6T CFET cell. The physical constructs save capacitance in all critical nodes intra or inter cell wise, eliminates pass transistors, reduces the well noises. Typical embodiment uses a 0.15-um-rule based layout, and 1.5V operation at 5 ns cycles. SBD are used extensively to achieve other circuit functions including level shifting, decoding, voltage generator, ESD and latch-up protection, leakage control, and dynamic VT setting in operation. Applications include SRAM, PLD, DRAM, CAM, Flash devices as standard product or embedded into any ASIC.

The following discussion uses a typical implementation to illustrate the concept. The feature size and device I–V parameter values are cited for general discussion. They are application dependent and evolutionary.

FIG. 5 is a storage buffer system in accordance with the present invention. With the knowledge of one of ordinary skill in the art, one can modify processes, circuit configuration and layouts in accordance with the present invention. A four transistor (T1–T4) cell forms a storage latch, which can be addressed randomly and set to store 1 (n1 high and n0 low) or vice versa. The diodes d1 and d2 are Schottky barrier diodes (SBDs) for steering or isolating the associated cell operations. The diodes are conducting when forward biased for reading or writing the cell states, but serve as an isolator when the cells are not or partially selected.

Circuit Operation (FIG. 5)

A typical design assumes a 1.5V internal supply, and has the decoded-word-line-write (WLW) signal net connected to the source nodes of T3 and T4 P-FET, and the decoded word-line-read (WLR) signal net connect to the source nodes of T1 and T2 N-FET. Conventionally, as shown in FIGS. 1–4, the P/N-device source nodes are normally connected to VCC/VSS power supplies, and uses pass transistors to steer the cells via selected pass transistor pair. The present invention utilizes steering diodes in conjunction with pulses applied to the source nodes of both NFET and PFET.

TABLE 1

Typical node voltages at Read, Write and Stand-by Modes

| Cell Modes | WLW Sel | Uns | WLR Sel | Uns | BL | /BL | n1 | n0 |
|---|---|---|---|---|---|---|---|---|
| Stand-by | 0.75 | 1.5 | 0 | 0.75 | 0.6 | 0.6 | 0.75/1.5 | 0 |
| Wr '1' | 0.75 | 1.5 | 0 | 0 | 1.5 | 0 | 1.0 | 0 |
| Rd | 1.5 | 1.5 | 0 | 0.75 | 0.75 | 0.5 | 1.5/0.75 | 0/0.75 |

Latch Mode (Table I)
Table I Illustrates the Latch Mode.

Assuming the latch state was set previously, and the bit-lines are at ~0.75 V (½ VDD), the latches of the unselected or partially selected cells are stable when WLW is at either 1.5V or 0.75V and WLR are at either 0V or 0.75V. The SBDs are not conducting.

The butterfly curves shown in FIG. 6 illustrates the concept of the latch operation and state transition traces. Two sets of state transition traces are plotted for 1.5V and 5.0V supplies. Balanced SRAM cells require that P and N FET sizes held width ratio of □=wp/2.5 wn approximately 1. FIG. 7 shows that the latch can be held more or less stable by decreasing or increasing the width ratio of □ in the cell. Table I shows the storage node voltage transfer traces during the bi-stable and switching operations. The latches are bi-stable at either states with bit lines at ~0.5V, and if WLR swings at 0V or 0.75V, and WLW swings accordingly at 0.75V or 1.5V respectively. The stored 1 node will latch at 1.5 V or 0.75 V respectively and vice versa for the stored 0 node. Both diodes are reverse biased or slightly forward biased.

Read Mode (Table I)

Table 1 also shows typical node voltages at read, write and standby modes. During read operations, assume node n1 is a "1", and WLW at 1.5V. The selected/unselected WLR is at 0V or 0.75V respectively, Vn0 is nearly 0.1V or less above WLR, Vn1 is at 1.5 V. d1 is off and d0 is conducting/off for the selected/unselected cells respectively. So there is a differential voltage across b and v/b of 250 mV due to the selected n0 state. The lowering action of WLR is actually enhancing the states of the selected latch, and the reading won't cause any disturbance for the unselected cells.

The read current and transition is controlled by the bus line discharging from its recharged state of 0.75V toward 0.4V. The transient rate is dependent on the combined on-resistance of the NFET plus SBD and related bus line capacitance.

Write Mode (Table 1)

To write a "1" state, the selected WLW pulls down to 0.75V, the unselected remains at 1.5V. This will reduce the latch hold condition to let it be overwritten by the bit-line bus signals. The write circuitry will bias the BL rising toward 1.5V and /BL to 0.1V or less. This will force the selected Vn1 to 1.0V, enough to topple the state. The unselected cells, however, hold its state since the '1' node sees 1.5V and is always stronger than the cathode node of the diode drive regardless of the bit line conditions. So the TWLC has a built-in protection scheme from write-disturb.

Figure 9:
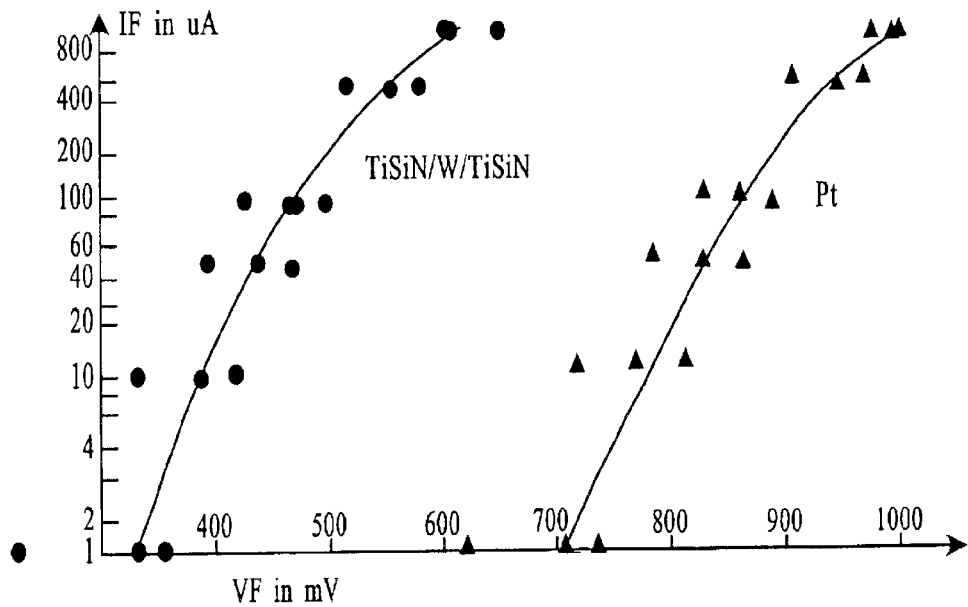
FIG. 9 shows a family of typical SBD forward IV curves using various barrier metals.
Figure 10:
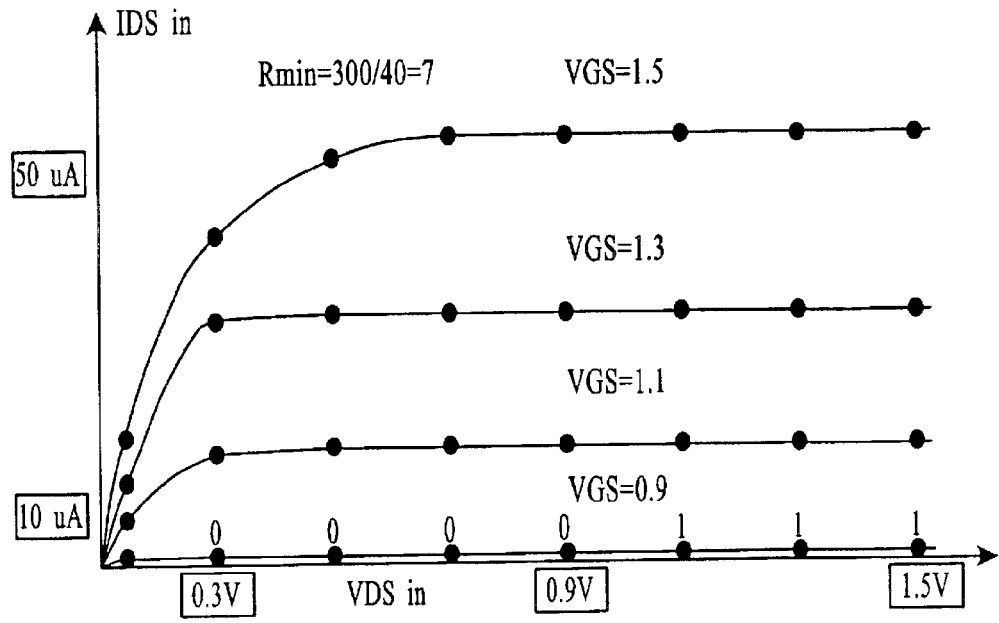
FIG. 10 shows the I–V curves of the NFET.

Further protection of write disturb can be obtained by adjusting the SBD barrier heights. Contact metal of Pt will yield more offset than TiW. So depending on applications, the designer can gain approximately 200 mV margin by adjusting Vtsbd. FIGS. 9–10 show typical I–V curves of SBD and the NFET.

Stand-by Mode (Table 1)

For fast switching reasons. The standby BLs are biased at VCC/2=0/75V or at 0.6 V which can be conveniently derived. At this level all latches will be stable to hold in their previous logic states.

Table II shows the waveforms of the cell terminals for consecutive write and read operations of 2 adjacent cells of 2 words sharing the same bit line bus. The sequence showed the pattern of write 0 and 1 read 0 and 1, and reverse the pattern.

TABLE II

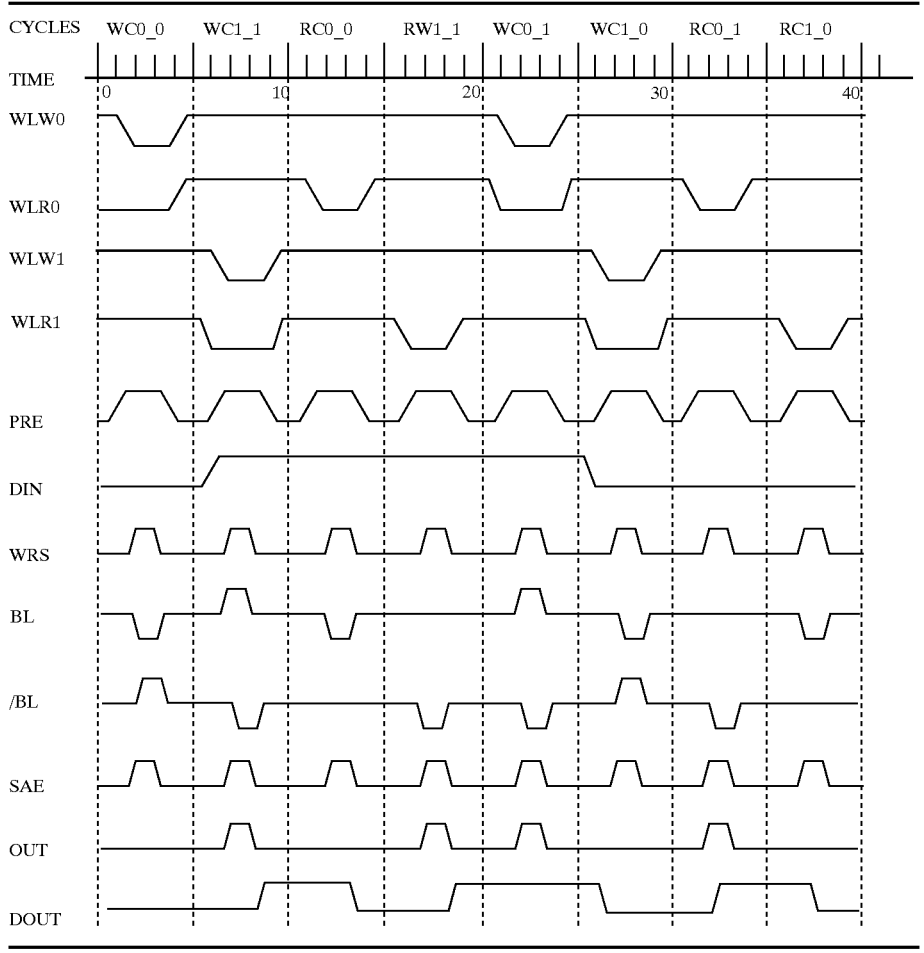

Switching waveforms of 2 bit array operation for write-read sequences

Other Useful Control and Driver Circuits

Numerous useful circuit embodiments can be formed using the combination of CDTL™ of CFET transistors and SBD. We simply demonstrate a few of its generic applications; namely, functional gates of level shifter and driver, decoder, operational amplifier, etc., and special effect such as to suppress latch-up action of the closely separated NFET and PFET transistors. Still another effect is to program the device thresholds with logic conditions, etc.

Some of the above circuit constructs are shown in FIGS. 11–14. They serve as set of control circuitries to form a custom circuit library supporting the DSRAM™ operations. It also demonstrates that SBD can be used as a general active element with conventional CFET/BiCFET/GaAs/SiGe techniques, thus adding a powerful option and flexibility for circuit designer.

Figure 1:
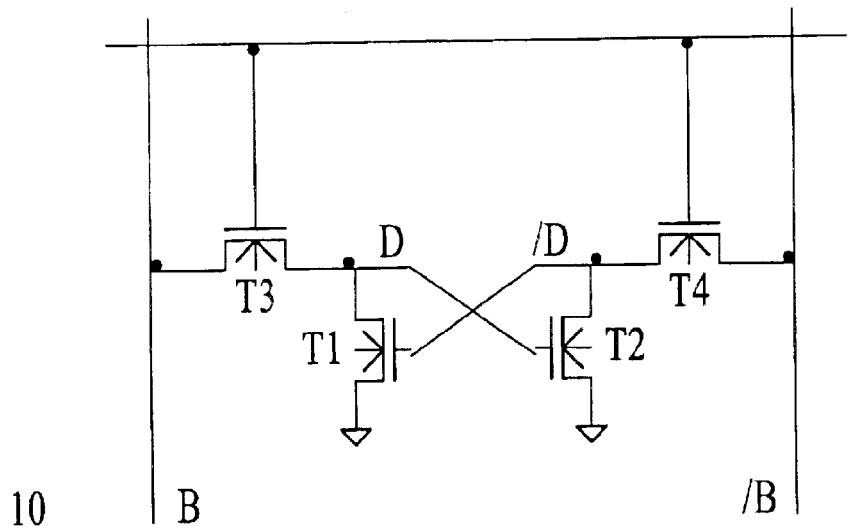
FIG. 1 is a first generation buffer storage system.
Figure 11:
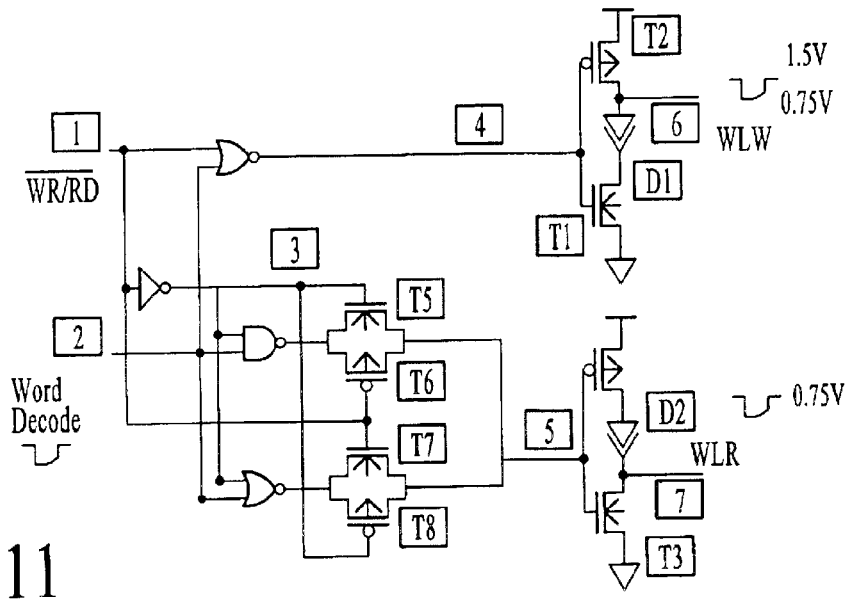
Figure 13:
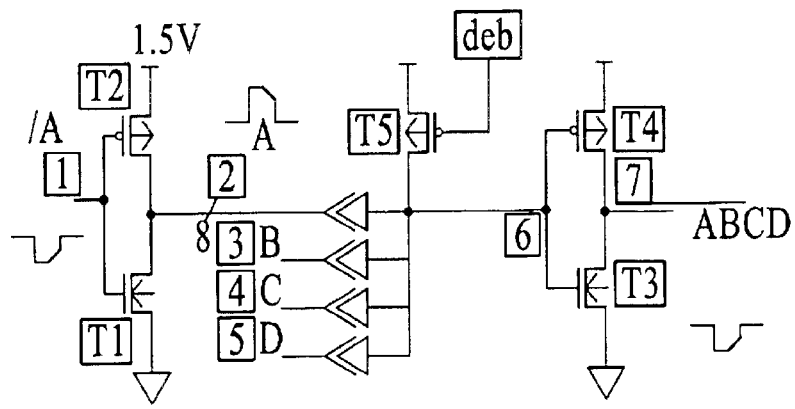
Figures 1, 13:
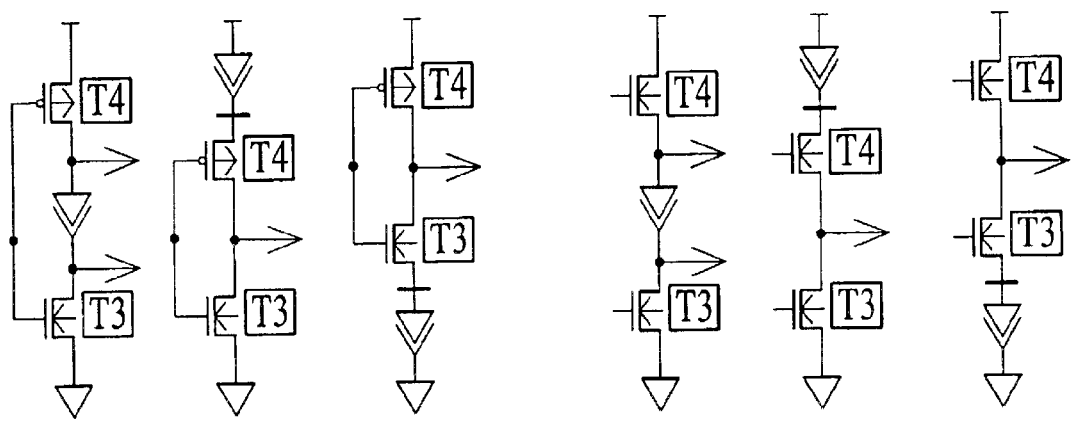

The Twin Word Line Driver (TWLD) shown in FIG. 11 uses the SBD (consider a high VB device of VF=0.7V) to achieve desirable level offset from main supply to form two totem pole ports; the word line for write (WLW) and the word line for read (WLR) for each word decode of the DSRAM cell array. Now for the WLR portion, when the input signal at node 1 governs the mode of operations. When it is at 0 V, the circuitry is in write mode. When it is at 1.5V, the circuitry is in read mode. During the write mode, node 3 is high, if node 2 is low (selected decode) it will make node 5 high, and node 7 (WLR) goes to low. If node 2 is high (unselected), it will make node 5 low, and node 7 goes to high. For the WLW portion, if node 2 is high (unselected), it will make node 4 to low, and node 6 (WLW) to high. If node 2 is low (selected), it will make node 4 to high, and node 6 (WLW) to low. Note that the low state of WLW is 1 diode drop above the ground of T1, and the high state of WLR is one diode drop below the VDD of T4. Still another variation, which is shown in FIG. 13-1, is that D1 may be moved to the source side of T1 and shared with of all decoders in the bank of the N FETs, so does that the D2 may be moved to the source side of T4 and shared with of all decoders in the bank of the P FETs.

During the read mode operation, node 1 is at high state. This will make node 4 to low, and node 6(WLW) to high. For the WLR portion, node 3 will be at low state. If node 2 is low (selected), it will make node 5 to high, and node 7(WLR) to low. If node 2 is high (unselected), it will make node 5 to low, and node 7(WLR) to high (0.75V).

The above circuit is only one of the solutions for the control logic. There may be other solutions which can be implemented by synthesis software to yield similar circuit functions, but may not be as efficient as we illustrated. The output pair signal levels are shown in Table I. Other state machine synthesis techniques can be used to yield similar logic functions but will not be as efficient.

The important concepts demonstrated are that

1) TWLD is efficient in using about ½ VDD swings, and
2) It is faster and consumes only ¼ of full swing word lines, and that
3) It separates the word line currents into two portions; one feeds the PFET sources which has less current requirement, the other feeds the NFET sources, which carry the heavier part of the ac switching current.
4) The cell array well has much less current spikes than the 6T SRAM constructs, therefore it reduces the noise level in the wells and improved array reliability. And since the well noise level is greatly reduced, it allows tighter spacing and less tapings between N type (for PFET) and P-type (for NFET) wells, this is an important area saving feature.

The NFET Totem Pole Drivers for ½ VDD Swing

Still other techniques are proposed, in later sections, to offer NFET totem poles for the TWL drivers. The above CFET totem pole configuration of FIG. 1 offers by default a partial signal swing desirable for this application. The drivers output levels may also be formed by various combinations of active CFET, NOMS drivers and diode offset adjustments as shown in FIG. 13-1. These constructs will offer voltage resources at no dc power from rail to rail to any intermediate levels at the designer's discretion. In our case they can be VCC/VSS+−Vtn,/Vtp and VDF; i.e. 0V, 0.3V, 0.4V, 0.5 V, 1.1V, 0.75V etc. These solutions are adequate and flexible to realize any level shifting functions. They are highly valuable circuit techniques for a wide range of ASIC and memory product applications including DRAM, SRAM, CAM, Flash, PLD, and u-processors.

Figure 12:
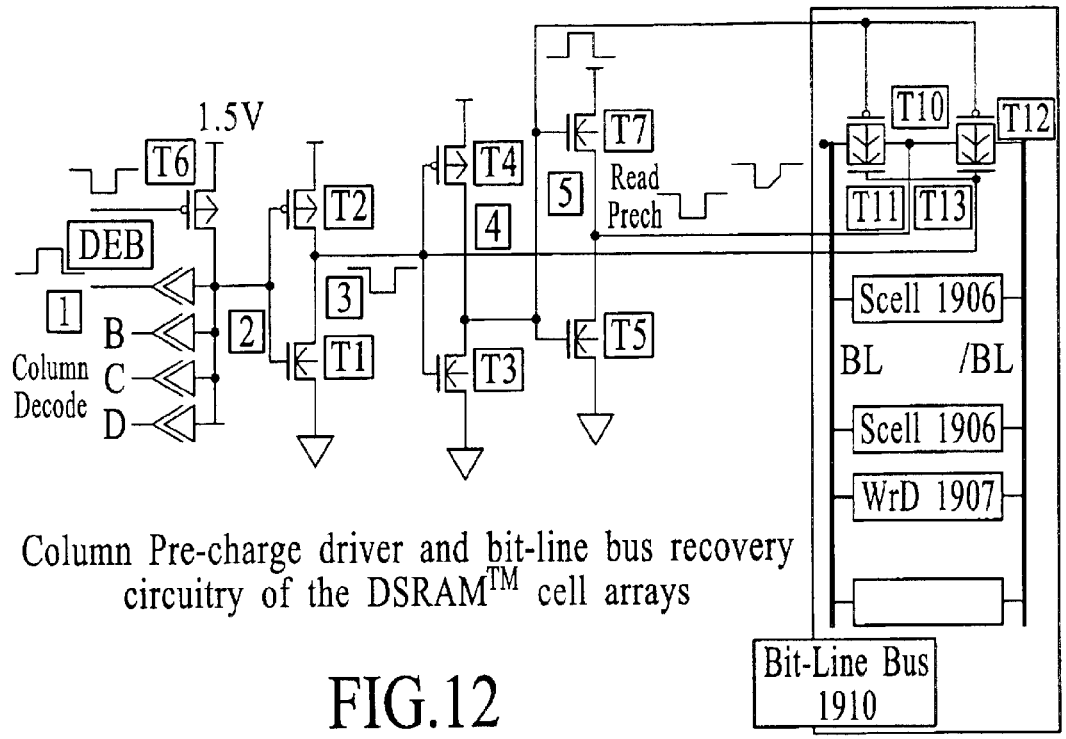
Figures 1, 12:
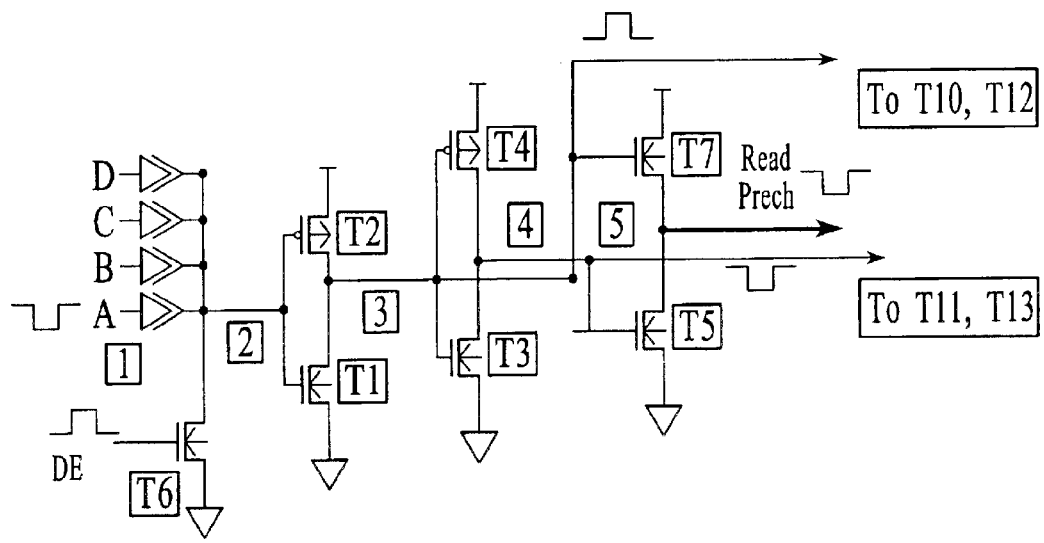

FIG. 12 shows the pre-charge control circuitry for the bit-line buses. Diodes A–D and T1, T2, T6 form one of the 16 4-way nand decoders, and output nodes 3,4,5 provide control signals and biasing voltage for the array bus lines for restoration to a pre-charged state. Diode A and other 3 way diodes receive other (address) decoding inputs. If all the inputs are high then node 2 goes to high, hence node 3 goes to low, otherwise node 2 clamps to low, hence node 3 remains at high. The assumption is that the diode conducts below 450 mV and Vt of T1 is around 600 mV, and the sub-threshold current of T1 at 450 mV is nil. If this is invalid then one must use higher threshold NFET. T6 has enable signal at its gate. When it is at Vss level, T6 will provide source bias current to feed the diode circuitry and perform decoding function. The enable signal can also be a higher order decoding output, such as 1-of-8 code from logic signals E,F,G to expand the decoders from 4-ways to 7-ways (16 decoders to 128 decoders). T3–T4 output node 4 provides out of phase logic signals from node 3 to control biasing functions (part of the Bit-Line Bus, drawing 1910). Nodes 3 and 4 provide both phases of internal logic for the NFET totem pole of T5 and T7. Outputs at 3, 4, and 5 make both the ½ VDD biasing voltage source (Read Prech) and the control signals to gate it to the bit line bus pairs (BL, /BL).

Prior to the beginning and after the ending of the pulsed period, node 5 is driving at 0.75 (or 0.6 with controlled variations) volt, T10–T13 are conducting, so both bus wires are pre-charged to ½ VDD. During the pulsed period for write or read, T10–T13 transistors are not conducting, and the bus wires are released to Hi-Z state from pre-charged state for other circuit activities described later.

FIG. 12-1 shows a circuit configuration variation of the same function. The decoding diode tree is formed and biased by a dual logic of FIG. 12 circuit. So instead of NAND decoding, the NOR decoding is performed. NFET is used for T6, and a limited biasing current is sinking to VSS. The SDB will clamp the PFET of T2 from conduction. The advantage of this configuration is that all diodes can be integrated into T6.

It is an important concept here that this circuit offers static intermediate voltage sources by circuit configuration using NFET totem pairs rather than CFET totem pairs, which provides rail to rail swings. This circuit offers reference voltage(s) regulator without dissipating any DC power.

If other intermediate levels are desired for applications, we can add SBD diode padding schemes between the drains of T5 and T7 similar to the situation described in FIG. 11 in the previous section. Therefore, with the level shifting schemes illustrated in FIGS. 11 and 12, assume VDD=1.5V, and Vt_fet_lo=0.3V, Vt_lo_sbd=0.3V, Vt_hi_sbd=0.5V, Vt_fet_hi=0.5V, we can derive several discrete voltage source levels any where between VDD and Ground; i.e., Vsource equals 0v (VSS_nfet), 0.3V (VSS_nfet+Vt_lo_sbd), 0.7V (VDD_nfet_hi−Vt_lo_sbd), 0.9V (VDD−Vt_nfet_Lo−Vt_sbd_lo), 1.2V (VDD_pfet_lo−Vt_lo_sbd or VDD_nfet_lo), 1.5V (VDD_pfet). When ever possible, it is recommended to use NFET totems because of the area and speed advantages.

Now, after the pr-charge is done, the bit line buses are let-go, i.e. Write-Data (1907) and/or the sense amplifier (circuitry SA 1908) takes over control to read the bus signals during the designated pulse period, when the sense amplifier is also active for the selected bit channel.

Table 2 shows the waveforms of two bits of the array switching operations.

The signals are listed in order to show critical timing relationships of a complex switching sub-system. The write and read streams are illustrated of two cells in the same bit-line buses 1910 in FIG. 12. In the test pattern of 8 consecutive 5-ns cycles, cell 0 of word 0 and cell 1 of word 1 are alternately written by a 0-1 sequence and read out, then followed by a reverse written and read action by a 1-0 pattern. The simulated results show that not only the array cells (of Scell) can each be successfully operated in the defined high-speed schemes, but their information will not be disturbed by opposite operations nor any cross-talk activities from the adjacent Scell. Each channel can process information at 200 MHZ cycles, so in a 16 bit wide chip using this core array, say 1M×16 SRAM, it may achieve 3.2 GBPS bandwidth. For a 256K×64 chip organization the bandwidth is 12.8 GBPS. It is believed that a fine tuned design the speed or bandwidth would be even higher.

FIG. 13 is the implementation of a diode decoder in comparison with the conventional CFET transistor decoder (i.e. NAND4 by stacked transistors). Two circuit concepts are demonstrated.

1) The DCFET logic and
2) Level conversion.

Node 1 may receive a low-level logic input with partial swing. This level may be 0–0.75 V or 0–1.5 V depending on the application. Therefore node 2 may be half or full swing dependent on the VCC setting of the inverter of T1 and T2. Node 2 drives the SBD decode bank at node 6. When all nets at A, B, C, D are at "1" state then node 6 will go to "1" state, which will drive the output node 7 to ground. If any of the diode inputs held at "0" state node 6 will maintain at "0" state, thus node 7 will be fully charged up to 1 state. The diode can be integrated into the input driver T2 or being discrete clustered at node 6. The circuit design trade-off is the wiring capacitance of node 2 or at node 6. So high speed large decoders favor the discrete version while low power high density applications favor the integrated decoders.

T3 and T4 form a rail to rail totem pole inverter which can be replaced by a NFET totem pole driver if in-phase half swing logic is desired as we discussed in the situation of FIG. 12. T5 serves both the biasing and logic extending functions explained in FIG. 12 above. The diodes clamp the "0" state of node 6 to a level just a little below the Vtn of T3, therefore it inherently guarantees its off-state of T3 at all temperature ranges yet assures fast turn-on switching when decoding is ready.

The above diode decoding schemes offer tremendous advantages over the conventional CFET nand/nor decoding. Because the CFET NAND devices are both bulky and suffer seriously in performance due to RC losses with staggering transistors and associated gate loading. Switching transients of NAND gates degrade drastically beyond 3 stacking transistors and/or large fan out wiring and gate loads.

FIG. 13-1 shows various circuit configurations to derive interface voltage levels. It shows a great flexibility to design the CDTL™ circuits for proper interface level while achieving area savings, and leakage controls.

Array Physical Design and Process Description

FIG. 12 shows sub-groups of DSRAM cells sharing common resources 1910; bit-line bus, pre-charge, write-data gate etc. The sense amplifier, decoder, and IO circuitry are conventional and hence are beyond the scope of this presentation. However, the cell operation modes described above are sufficient for accessing the large array of cells with burst read/write cycles of 5 ns (data rate will be 200 Meg Bauds) per channel. In a 1M×16 array sub-system, the bandwidth will be 3.2 GBPS, 12.8 GBPS for a ×64 chip. We now present the physical design concepts.

1. Array Physical Design Constructs (Reference FIG. 12 A, FIG. 12B, FIG. 1)

Figure 12A:
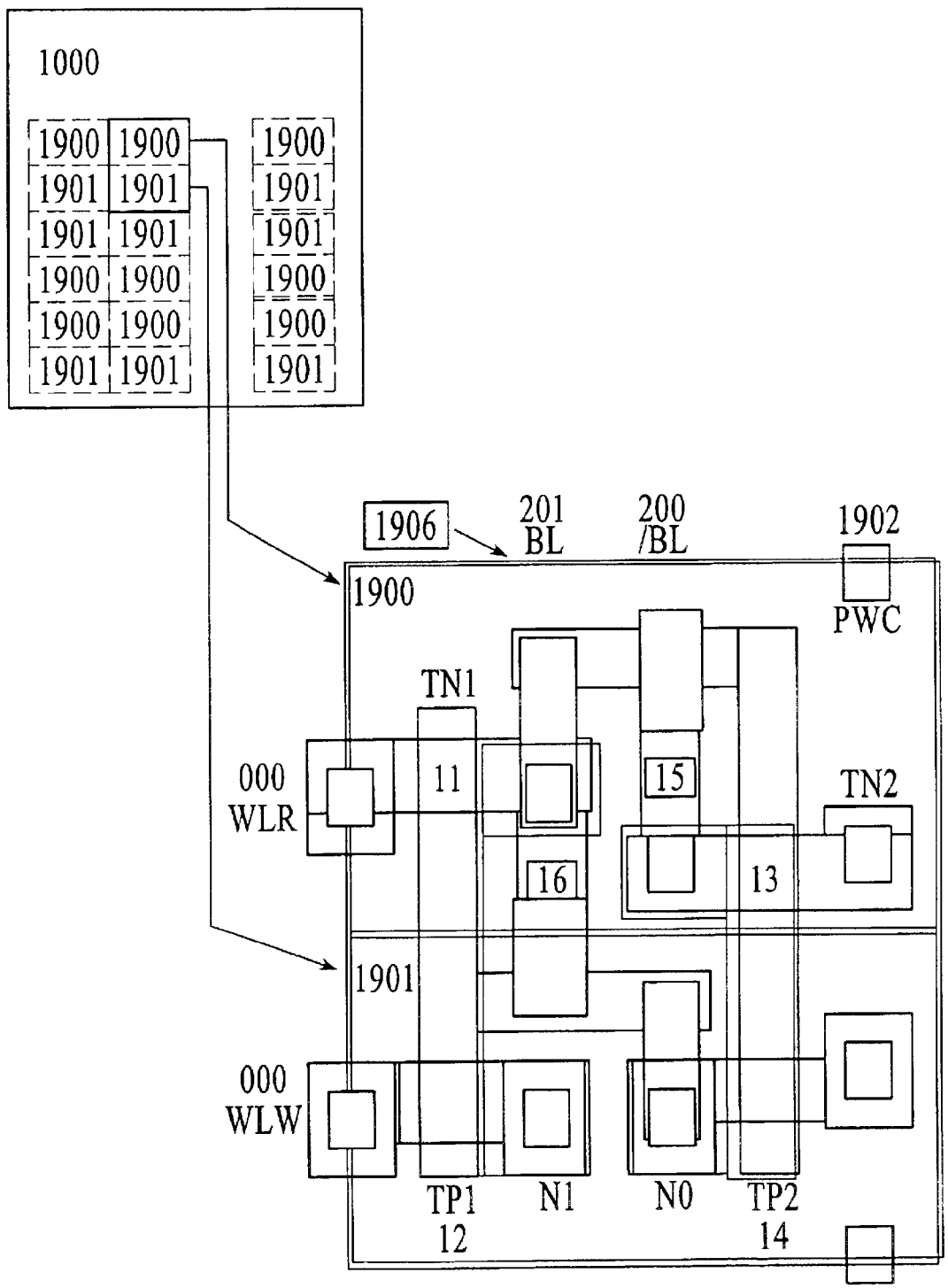
FIG. 12A shows layout partial composite view of the basic DSRAM™ Scell 1906 in a sub-array group of a large implementation 1000.

Some of the layout details are illustrated here for completeness. FIG. 12A shows layout arrangement for a sub-array group of a large array implementation. These designs considered the area efficiency as well as performance and reliability issues comprehensively with given device rules from process definitions. Repeating array constructs are shown in the left (drawing 1000). Again, the wiring layouts here demonstrates concept only, they are not optimized.

There are banks of cells in a row, which composed of cells detailed by region 1900 and 1901 shown in the right. The adjacent cells are first making a pair by left/right mirror images along the left edge of region 1900, then repeating pair wise along the right side of the pair to form a quad. Sub-region 1900 basically groups all NFET of the array cells as they all share one contagious P-well region, which has periodic well contact (1902, PWC). Sub-region 1901 groups all PFET of the array cells as they all share one contagious N-well region, which has periodic well contact (1903, NWC).

The sub-array expands vertically row after row by mirroring constructs top/bottom wise along the bottom edge to form the dual rows then quad rows with the same principle.

Figure 12B:
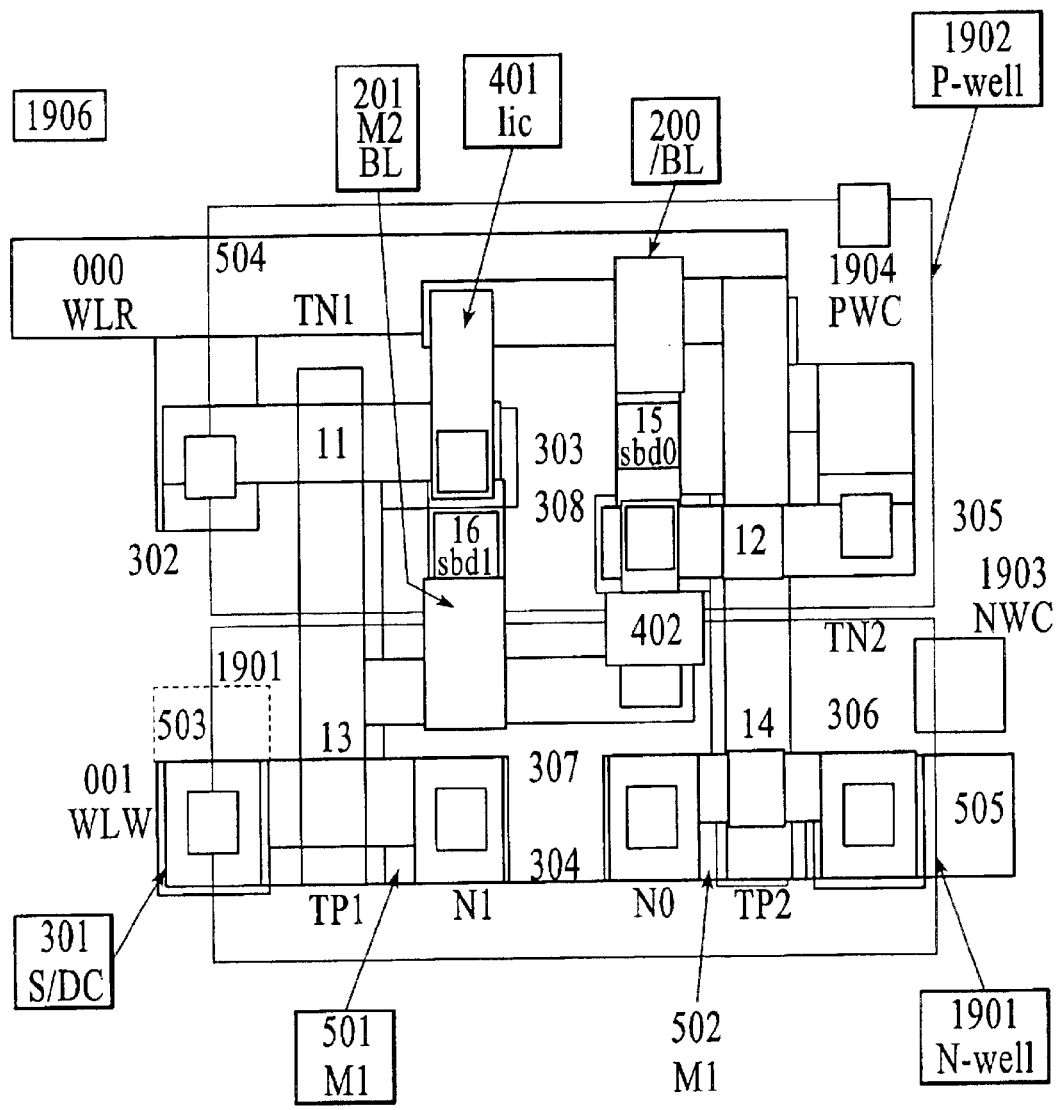
FIG. 12B shows a detailed layout arrangement of the basic DSRAM™ Scell elements.

Signals are arranged accordingly with the repeating patterns. Within a cell shown in FIG. 12A right side, there are top views of 4 FET; TN1, TN2, TP1, TP2 (Region 1900–1901:11, 12, 13, 14) and 2 SBD (Region 1900:15, 16) partially wired according to the circuit schematics shown in FIG. 1. The intra-cell wirings are done firstly by local interconnect metal from n1, n2 to the gate-poly on oxide. FIG. 12B (Region 1906) identify all device node labels and connection types with lower layer items brought up for discussion.

In the NFET sub-region 1902, there is bias contact (1904, PWC), 2 NFET with integrated SBD (TN1:11, TN2:12, SBD1:16, SBD2:15). In the PFET sub-region 1901, there is bias contact (1903, NWC), and 2 PFET (TP 1:14, TP2:13). The source/drain contacts are labeled 301–308. Local interconnects (401, 400) bridge the cathode of sbd1 to the opposite inverter gate poly; 303 to 12 and 14, and the cathode of sbd0 308 to 11 and 13. The P/N drains of 11 and 13 are connected by M1 (501) between 303 and 304 (N1), like wise by M1 (502) between 308 and 307 (N0). The inter-cell ports are BL (201) and /B (200) buses which run North South direction by M2. The twin word lines run East-West direction by M1. WLR (code 000:504) connects two NFET sources at 302 and 305. WLW (code 001:503 and 505) connects two NFET sources at 302 and 305.

2. DSRAM Device and Process Description

Cell Device Layout and I–V Curves

Figure 9A:
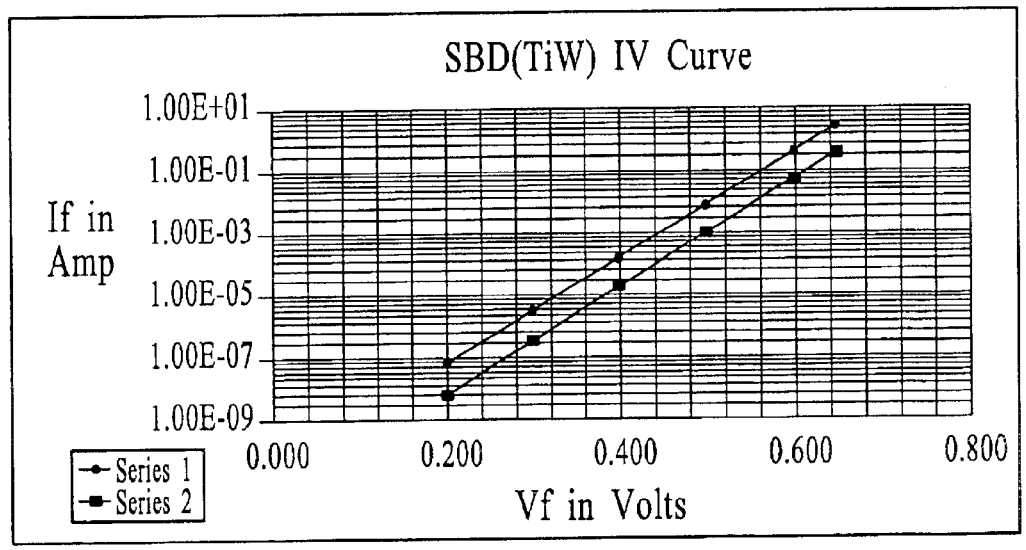
FIG. 9A shows the same for different anode sizes.

FIG. 9 shows a family of typical SBD forward IV curves using various barrier metals. FIG. 9A shows the same for different anode sizes. Fine process adjustments may realize fully customized characteristics in terms of ideal cut-in voltage, and the resistances in the low and high current levels. FIG. 10 shows the I–V curves of the NFET. The I–V curves of the PFET is not shown. It is understood, for the same size, PFET is about ½ times weaker than the NFET.

Figure 14A:
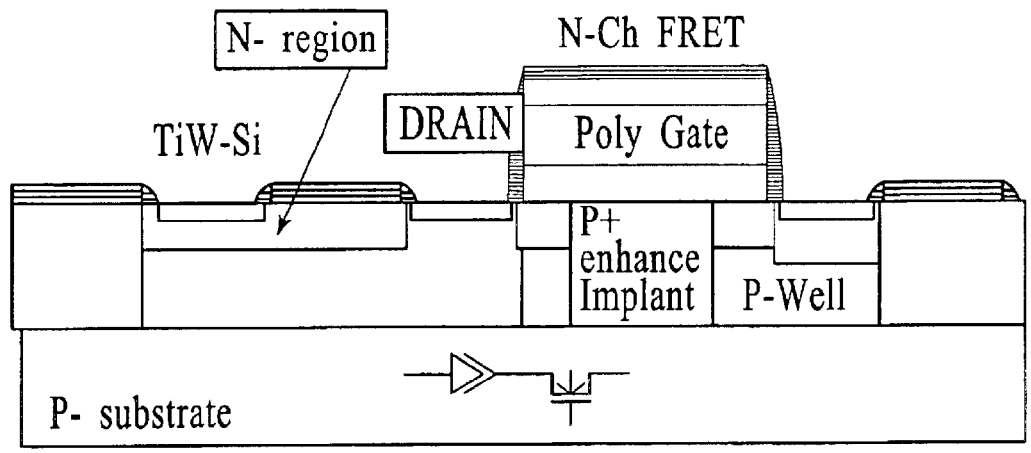
FIGS. 14A and 14B depict a typical embodiment for the NFET FET and its integrated Schottky barrier diode.
Figure 14B:
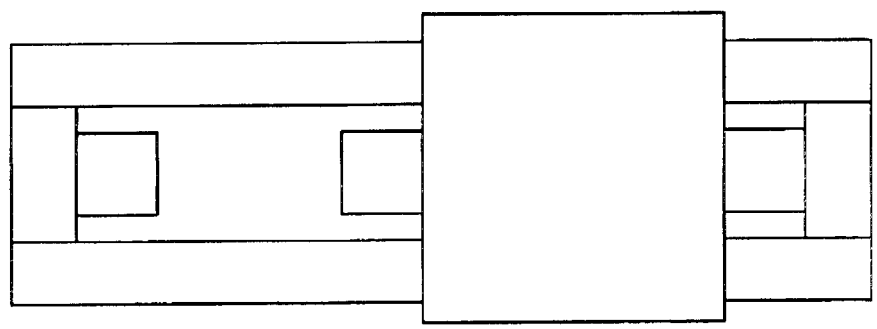

It is important to point out that all geometric details, and I–V characteristics can be fine tuned upon desirable choices of device dimensions, process parameters, and to attain process compatibility with the conventional CFET bulk and metal wiring processes. The other detail processes, i.e. isolation schemes, are also adjustable for many reasons to fit main product applications such as in the case of Flash memory, where the LOCOS isolation is used rather than the trench isolation schemes. FIG. 14 shows the vertical cross section, and horizontal layout schematics of the integrated NFET-SBD pair.

Figure 2:
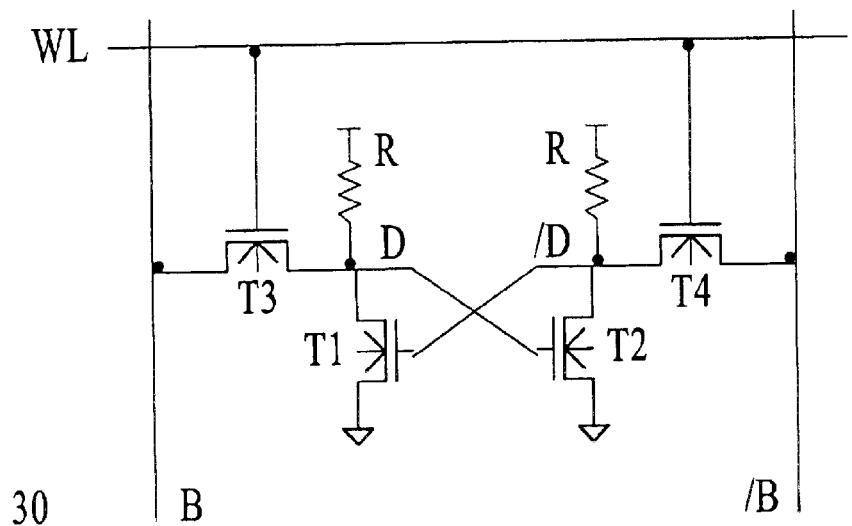
FIG. 2 is a second generation buffer storage system.
Figure 3:
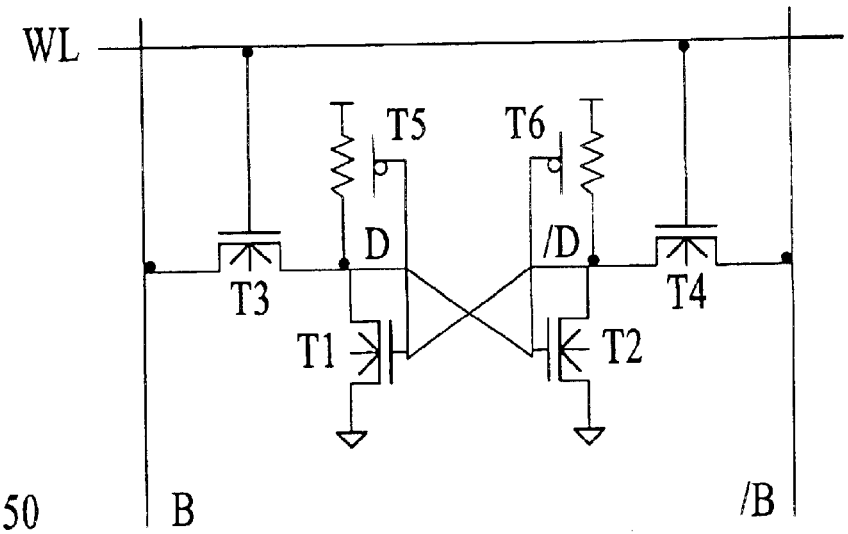
FIG. 3 is a third generation buffer storage system.
Figure 4:
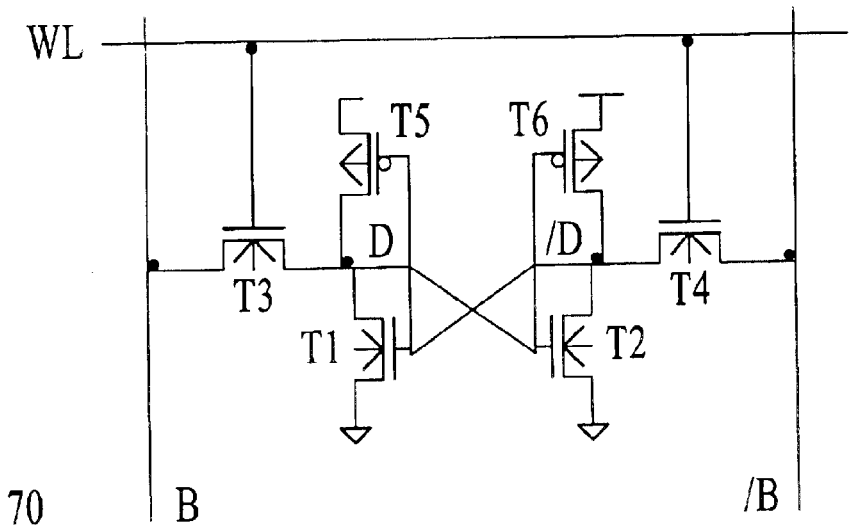
FIG. 4 is the fourth generation of conventional buffer storage systems.

The SCFET Technology (FIGS. 14, 1, 2)

The SBD CFET (SCFET) is derived with the standard CFET technology with deviations in adding a mask step to select the anode hole openings, and barrier metal preparation. The cathode resistance implant is an option to lower its series resistance for tailoring a desirable I–V curve. The diode can be separated from the NFET by itself, and can also be incorporated in multiple anodes sharing the same cathode contact region. Other applications include but not limited to the decoders, well biasing, VT lowering or enhancing, ESD and latch-up protection. The anodes are made in various embodiments such as in the source/drain regions, well regions and/or near the guard ring regions of an IO block. These features are disclosed in this section.

Figure 15:
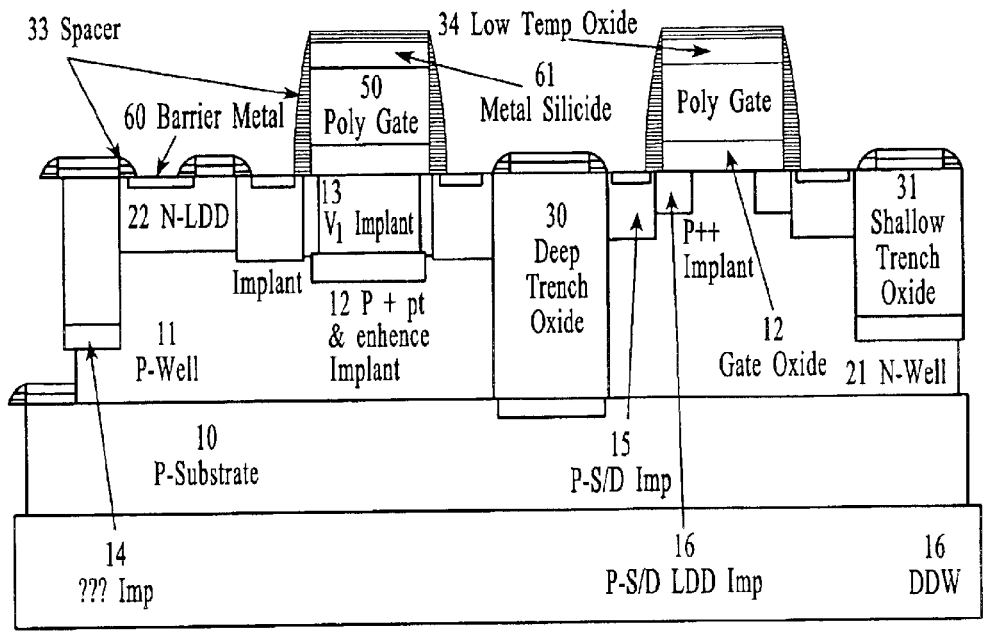
FIG. 15 shows a portion of the vertical device cross-sectional view.

The process steps and conditions are elaborated. This is depicted in region 200 shown in FIG. 15, a typical embodiment is presented for the NFET FET and its integrated Schottky barrier diode. These are key elements to form the latch, T1 and D1 in FIG. 1 and FIG. 2 (Circuitry 1906), described in the previous section.

Following the conventional CFET processes, we prepare a P-type 100-crystal substrate 10, the wafer is about 10 mils thick, the Boron concentration is approximately $10^{15}$ atoms/$cm^3$. Then we prepare the device isolation walls(thick~2 um, and/or thin~0.4 um, layer 30) with enhanced P-type diffusions at their bottom (14). In the mean time, diffused N-well (21, C=1E16 level) and P-well (11, 10E16) sub-regions are formed during the oxide drive-in thermal cycles. Several schemes in the industry are well known; the LOCOS and TRENCH approaches can both be considered depending on cost-performance and other functional requirements in the specific product applications. Here we cite our case on the conventional Thick and shallow Trench isolations 30, 31.

The conventional wafer process then calls for gate region threshold (13) and punch through protection (12) implants. After oxide removal, thick gate oxide GOX 7 nm is grown (not shown, but similar to 32), then thin gate oxide (GOX layer 32, 3.5 nm) and Poly Si Gate deposition (50) and their formation for the internal 1.5 V devices and external 3.3 V devices used for the high performance products. Other higher GOX thickness are well characterized in the literature for higher voltage operations and cost-performance applications. The gate-polys are delineated by the RIE method with gaseous etch agent, then coated by the low temperature CVD oxide, RIE again to form the gate sidewall spacer (33). The spacer RIE also forms the self-aligned contact openings.

The FET source drain regions then are treated with $P^{31}$ implants in the N FET P-well region to reach and the N-type donor concentration at 1–5.0E16 atoms/cm$^3$ in the source and drain region (layer 22, and 16 for the P-FET). This is the desirable background for making SBD anodes as well as yielding NFET LDD side diffusions to lower the lateral electric field intensity near the drain. The N++ implant 23 concentration is about 2.0E20 atoms/cm$^3$, is done near the surface, to further lowering the source/drain resistances to ~30 ohm/square surrounding the contact opening region. The SBD Anode region (60) would be blocked out from receiving N++ implants, so contact metal silicide (TiW/Pt at 650° C. or lower) is formed at the designated anode contact hole opening (60). Elsewhere, the same contact metal will form ohmic contacts at the N++ (23) or P++ (15, for PFET) regions of the source/drain contact hole openings. The SBD cathode region (N-background) started from underneath the anode contact area, extended laterally all the way to the NFET source/drain N++ region. This region, ~0.3 um deep, may also receive optional buried N++ implant, thus an optional mask can be used, to lower cathode resistance of the said SBD.

Related metal processes are well known by conventional approaches. The preferred embodiment cites TitaniumW/Platinum thin film depositions ~0.02 um depth, silicide sintering, and etching. This Ti—Si layer can also be used for short runs and light currents to connect the S/D to the top Poly openings in the non-critical area (layer 61, local inter-connect, described in later sections), W and/or Al deposition and etching etc. to form SBD with various barrier heights or ohmic contacts, and interconnecting $1^{st}$ metal wirings ~0.4 um thick.

SBD Structure, Integration to NFET, and Device Curves (FIGS. 9, 9A)

The method of making a SBD device in a bipolar NPN transistor structure were disclosed by Chang in U.S. Pat. No. 4,005,469. Here we redefine it and apply to the MOS N-type transistor embodiment. The fabrication processes of making the integrated NFET/SBD are essentially compatible to CFET processes for the part of diffusion and isolation, implants, contact opening, contact metal and inter layer metal wiring steps described above. The major deviations involve the pre-contact preconditioning, barrier metal selection, and 1 or 2 (optional) masking steps.

The I–V characteristics are illustrated in FIG. 9. At low current levels, the barrier height determines the cut-in voltages. The very contact metal work function and the N-type Si impurity concentration level in the silicide proximity determines barrier difference. It is well known in the field to use Pt or Al to make SBD conducting at 0.6 V level. The Ti—Si diode cuts in at 350 mV. Still another means to adjust forward I–V curve is the contact sizes, buried cathode resistances.

The key process steps (FIG. 14) are to select proper contact metal for deposition, sintering and etching, make ion implant beneath the contact region to lower the cathode series resistance, this region is extended to the MOS drain contact area, and forms an integrated NFET/SBD device pair. This integrated structure has minimum anode-cathode area, and its packet capacitance, compared with a discrete pair. Multiple SBD can be efficiently embedded in a common drain/cathode region such as in a decode logic input signal drive situation.

The Other Circuit Applications

Examples of circuit blocks using SBD and CFET FETS other than SRAM cells are shown earlier in FIGS. 11, 12, 13, and more in FIGS. 16–21. It is used to form SRAM cells, word line drivers and recovering controls, decoders, ESD protector, latch-up suppresser, localized VT controller etc. and many others can be derived.

SOI Embodiments

Figure 16A:
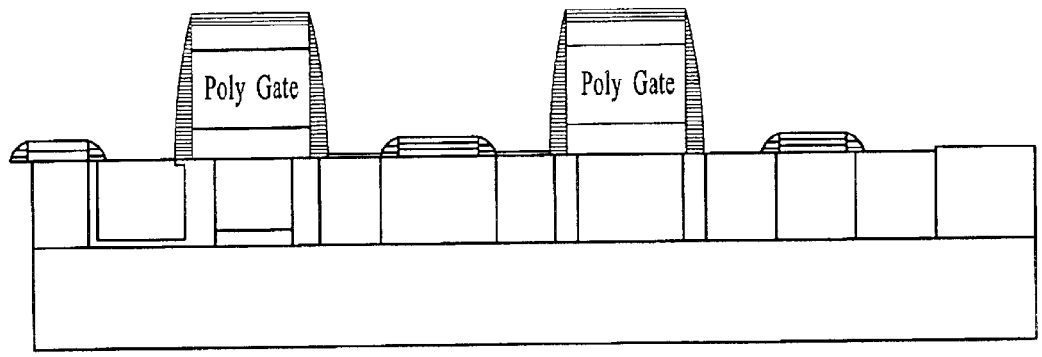
FIG. 16A shows a circuit configuration using diode with integrated NFET pointing inward to the internal nodes of the latch.
Figure 16B:
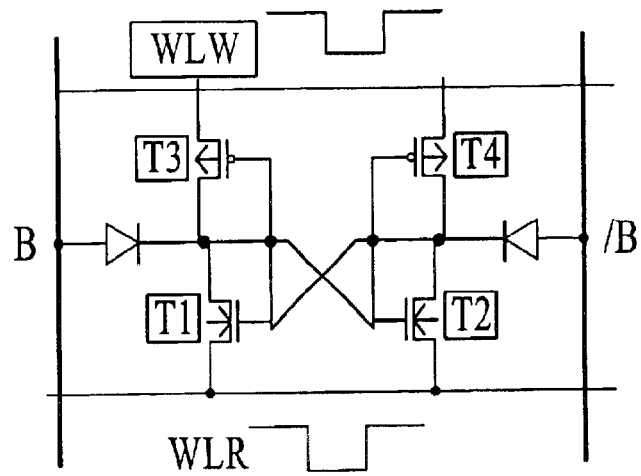
FIG. 16B shows a circuit configuration with integrated PFET pointing outward from the internal nodes of the latch.
Figure 16C:
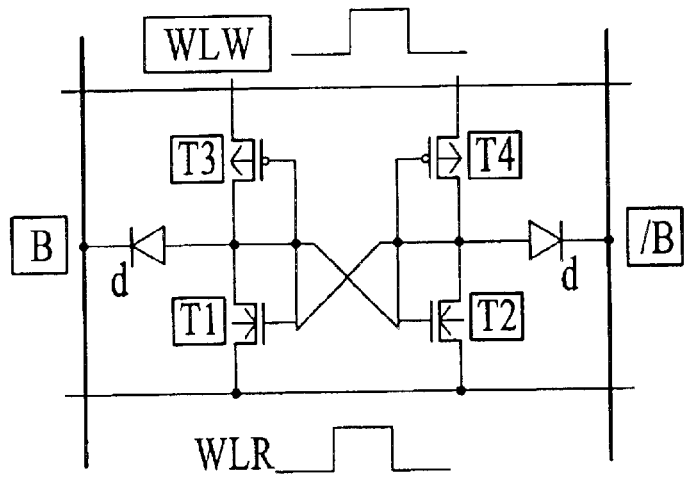
FIG. 16C shows the respective circuit schematics for the P-N junction diode implementations.

FIG. 16 cites an embodiment applying the most aggressive implementation with the Silicon On Insulator (SOI) scheme. In this device architecture, there is no diffused wells (N and P wells) involved, so in addition to SBD diodes, the PN junction diode can be used as options to construct the 4-Tx cell. Two circuit configurations are proposed. One uses diode with integrated NFET pointing inward to the internal nodes of the latch (FIG. 16A), the operation is similar to our DSRAM case. The other uses diode with integrated PFET pointing outward from the internal nodes of the latch (FIG. 16B), A dual operation with respect to this invention can be developed. FIG. 16C shows the respective circuit schematics for the P-N junction diode implementations.

Figure 17:
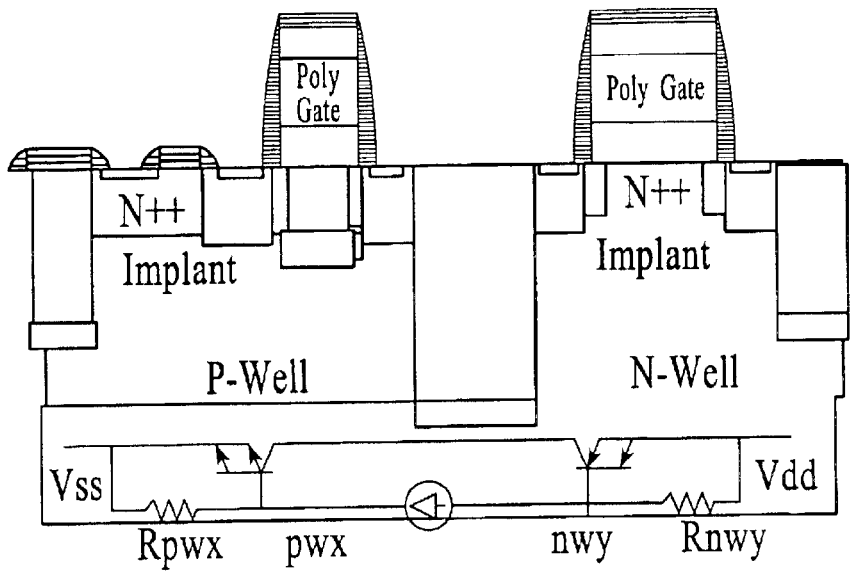
FIG. 17 shows the parasitic PNPN latch-up circuit model of the unprotected CFET circuits in the core or IO area.

Latch-up Protection (FIG. 17, Region 800)

Figure 18:
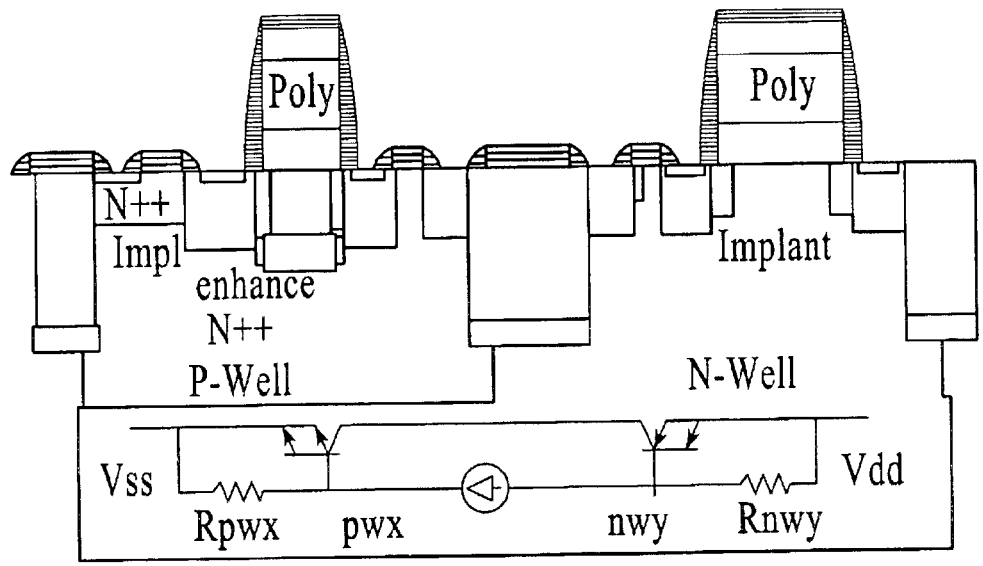
FIG. 18 shows the conventional means for protection by well tapping.

FIG. 17 shows the parasitic PNPN latch-up circuit model of the unprotected CFET circuits in the core or 10 area. FIG. 18 shows conventional means for protection by well tapping. It costs a lot of spacing to place guard rings to keep NFETs separated from PFETs.

Figure 19:
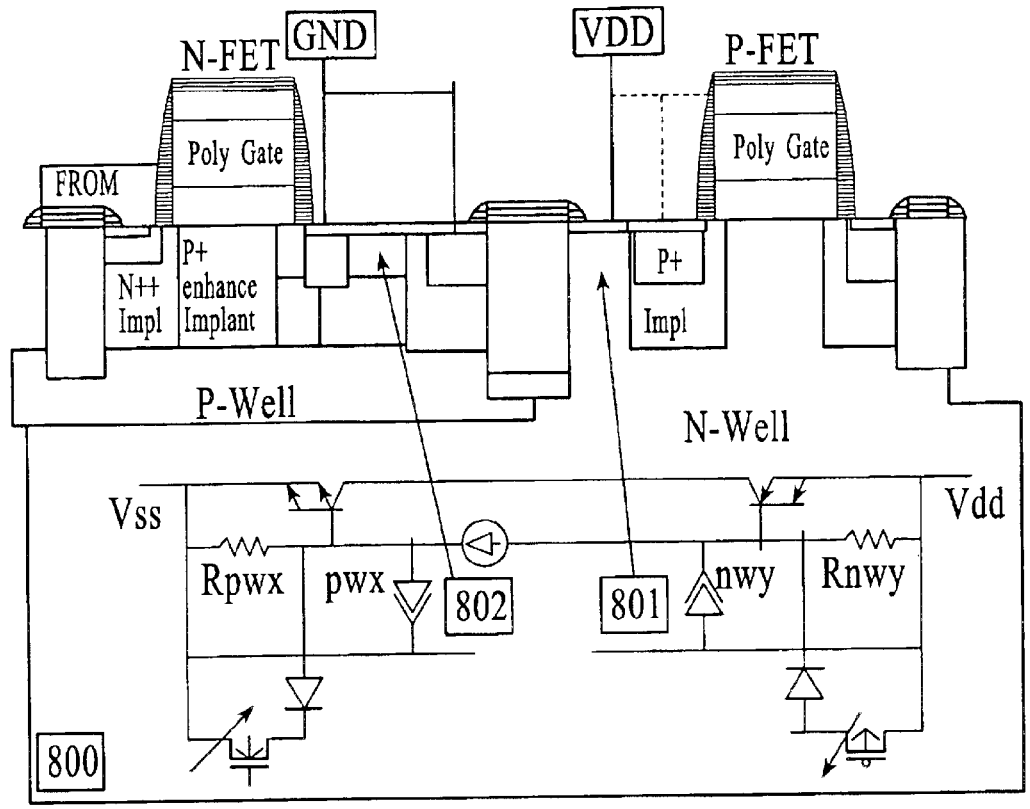
FIG. 19 shows a scheme to form SBD and connect it between the hot wells and GND/VDD source contacts.
Figure 20:
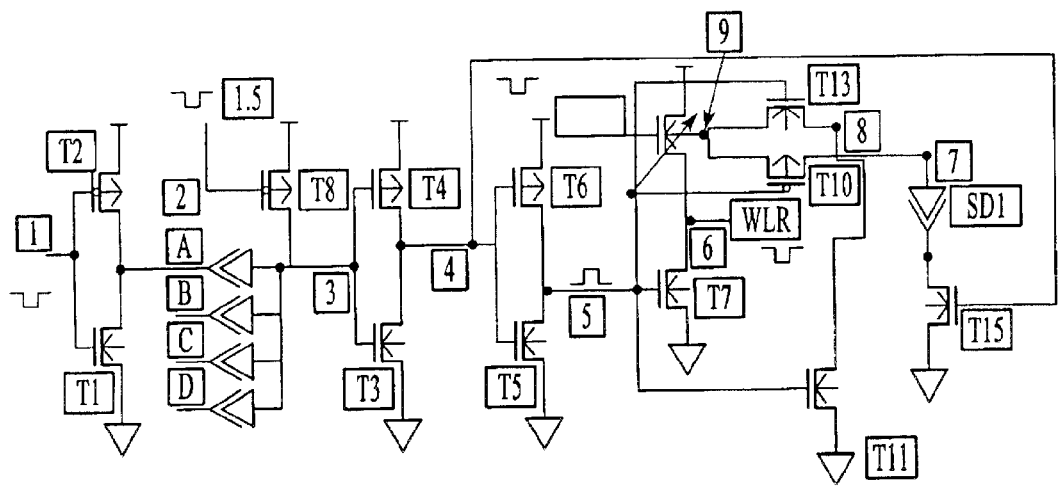
FIG. 20 shows the feature of the concept of FIG. 19 in which wells may be biased with either cold or hot by logic switching circuits.

We devised a scheme in FIG. 19 to form SBD and connect it between the hot wells and GND/VDD source contacts. This practice can cause two circuit effects. First, the SBD suppresses the well to the bulk FET parasitic P-N junctions in each well, so the PNP/NPN parasitic device actions are eliminated by the SBDs. Second, if the hot wells are charged up for the P-well, or pushed down for the N-well, to the clamped diode voltage, it will cause the main FET devices in the localized regions VT shift toward lowering values. Therefore, one may take advantage of this situation by biasing the wells with either cold or hot by logic switching circuits. This feature is demonstrated in concept in FIG. 20.

We have a totem pole driver pull-up device T9, its well is connected to logic circuitry which vary according state of the related signals. The circuit nodes 1–4 are identical to a decoder discussed in FIG. 13. The difference is that we need a partial swing logic levels. Node 4 has the rail-to-rail signal, the WLR output at node 6 requires for 0.75 V when idle and 0 V when selected. This is obtained by a NFET totem pole output there (T9, T7 pair). More to this point, the high level is obtained by the Vtn drop from VCC of T9. Its P-well node 9 is controlled by a biasing circuitry from nodes 7–9.

When the driver is unselected, node 9 (P-Well of T9) is biased at 0.5V via T10 and node 7, T15 and SD1 are on, T13 is off, so node 6 is at 0.8 V (T9, hot-well, Vtn=0.7V). When the driver is selected, Node 4 goes low, node 9 is biased at 0V via T13 and node 8, T10, T15 and SD1 are off, so node 6 is at 0.7 V (assume T9 Vtn=0.8V). We have thus achieved dynamic Vtn control, which gives different active device characteristics by circuit means rather than by process (Ion Implant). In a situation of making a mid-level voltage source generator without consuming dc power, this fine tweak may be an important technique.

Still another advantage of this invention is the size of related hardware. Since WLR has heavier current load than WLW, It is important to use a NFET to drive than PFET which is slow, larger and more process variation. So the NFET totem is much more efficient than the CFET totem. And the related well control circuitry can be implemented with minimum rule devices. Thus this scheme can be incorporated to all decoders around the peripheries. And we have achieved all advantages in speed, and savings in power and area.

Figure 21:
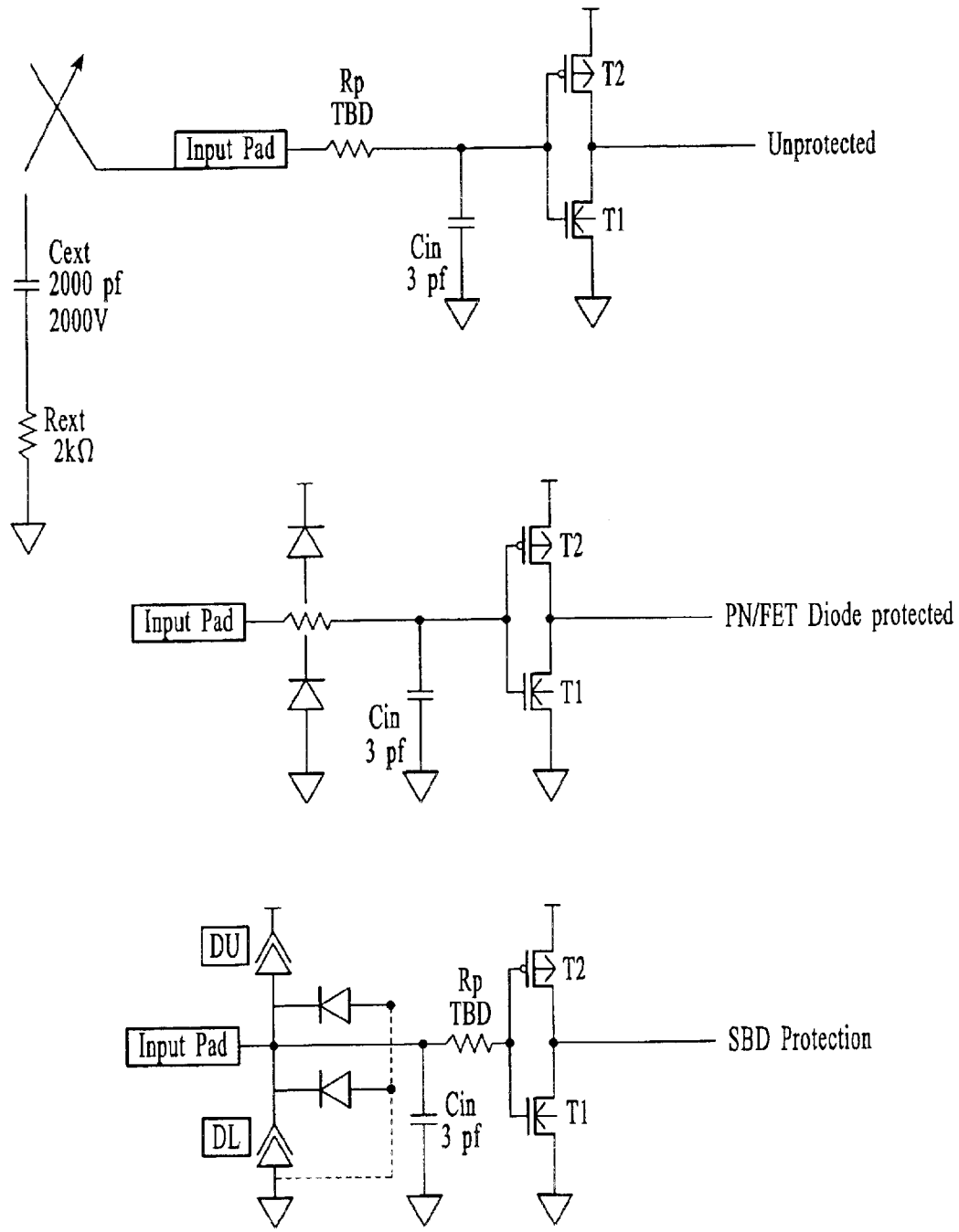
FIG. 21 shows an ESD scheme, whereby SBD are used to discharge excess charges stored externally without damaging the input gates and without speed degradation.

ESD Protection (FIGS. 9, 21)

Still another application of this invention (SCFET) is to use SBD in the input circuitry for ESD protection. FIG. 21 shows an ESD scheme, whereby SBD are used to discharge excess charges stored externally without damaging the input gates and without speed degradation. The excitation model is a 2000 pf+/−2000 V with series resistance 2000 □; a typical human body contact environment.

Unprotected inputs will see huge current spike of 1 A and time constant of 4 uSec. This arc will strike the IC and destroy wiring, any device connected to the input pads. Conventional protection uses PN junction diodes of FET diode configurations for series resistance and current surges. However, the side effect is it comes with heavy speed penalty. The parasitic capacitances and series impedance easily added the Cin to several pf, the slew rate at the input gates degrades severely when receiving signals.

We propose using SBD for the ESD protection. In FIG. 9 diode curves, we can see that the VF of a 0.5×0.5 um ideal SBD is very effective to handle huge currents. The series cathode resistance can be very high for it was made by a shallow N-layer near the surface. If the parasitic junction is grounded, The combined SBD of DU and DL should be adequate for ESD protection. The added input capacitance is nil, and the area is much smaller than conventional designs.

3. Summary of the Advantages 3.1 The Schottky-CFET Technology

Process compatibility: It is 95% compatible with existing CFET processes. Therefore the cost barriers of process changes are minimum. The main deviation from CMOS are Schottky device formation; the Schottky-contact select masking, the barrier metal deposition, and the surface concentration preparation, which are compatible in nature but need to be fine tuned for the desired device properties.

3.2 DSRAM™ 4T-cell (FIG. 22) and Its Control Peripherals

Figure 22:
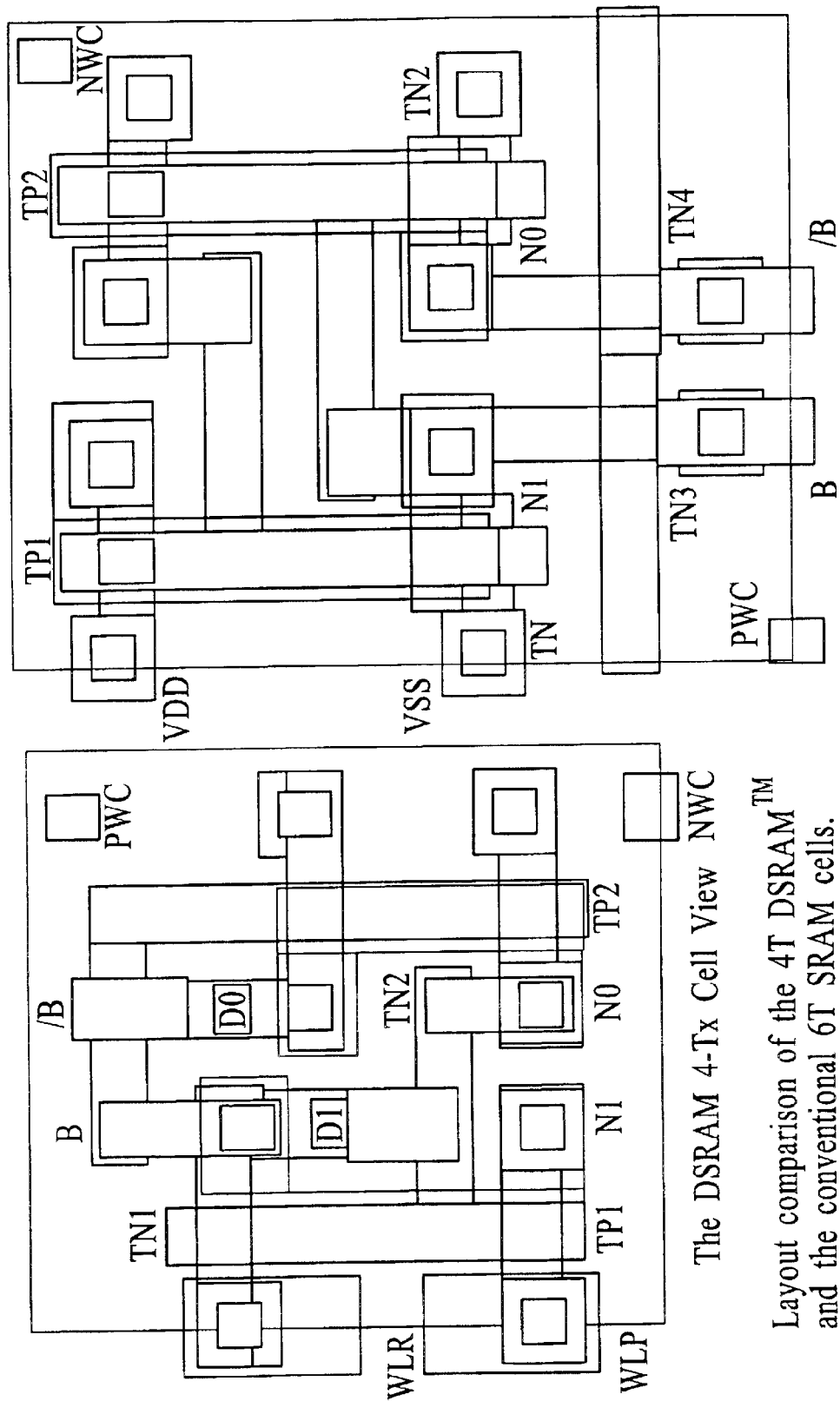
FIG. 22 shows a side-to-side layout comparison to the 6-T cell using same features and rules.

The primary advantage of the cell is its reduced area in the bulk and cell stability. This is based on circuit and device architecture hence is independent of process rules. FIG. 22 shows side-to-side layout comparison to the 6-T cell using same feature features and rules.

In the DSRAM circuit configuration and device topology, we replaced the pass transistors of the conventional 6-T cell with the SBD diodes, and achieve many Area, Speed, and Power advantages from the Cell Array and its Control Logic:

1. The 4T+2 SBD architecture only takes ⅔ area of the conventional 6Tx implementations. 25–30% density and speed advantage is achieved.
2. The cell topology provides special write/read protection by diode isolation.
3. The bulk area saving comes mainly from the elimination of poly word line. Instead, the word decode function is provided by complementary signals to the sources of the FET. And the three terminal pass transistors are replaced by a two terminal integrated diodes. Although two word line signals are required, they are absorbed into the supply lines, and they may be distributed in the stacked metal layers.
4. The new Twin Word Line Driver ports only see FET source pocket capacitances and the source to gate overlap capacitance, which are much less than the full gate load of two pass transistors. Besides, WLW only sees PFET load, and WLR sees NFET load, therefore the total and each twin driver load, are greatly reduced. The decode sub-driver sizes may be smaller. Designer may be able to handle more cells in the word line direction, improve speed, or do both.
5. SBD decoder is faster and uses less stages, and less total areas.
6. The TWLW and TWLR signals have reduced signal swing from rail to rail to VDD/2. Power saving is 75%.
7. Both WLW and WLR are using negatively going pulse, area efficient and speedier circuit can be implemented since it uses a N-Type pull-down driver.
8. Repetitive P-well contacts may be moved to less critical area. Since there are no pass transistors, and the WL pitch is ⅓ less, it follows that along the bit lines, there are no more drain capacitance, and drain to gate overlap capacitance with each cell. So the BL capacitance is much smaller.
9. For the shorter run of bit-line bus nets, the designer can either increase the word size dimension (higher array capacity) or gain faster speed or both.
10. Both the PFET and NFET can now use minimum width. The cell size is further reduced. The stored data has better noise margin and read/write mode disturbance protection by the SBD isolation, circuit configuration, and circuit operating conditions.
11. Combined drain area of the cell nodes D or /D is less than the same of the six transistor version, since all active components use minimum geometry, and pass NFET are replaced by a integrated SBD which have less depletion capacitance and no diffusion capacitance. The intrinsic delay of the cell improved when access from either bit lines or word lines.
12. Since SBD current is using majority current carrier so no recombination current exist, therefore the P-well is more stable since only 2 NFET per cell instead of 4 in the P-well bed.
13. The Bit line, word line, and cell node capacitances are significantly reduced which benefit both the intra and inter cell switching speed, and control circuitry speed.
14. The bit-line decode, pre-charge, and biasing control circuitry is a fully customized 3-function-in-one block. It controls the bus nets for desirable pre-charge voltage level (½ VDD), achieving 3-state isolation to avoid voltage reverse stressing to the cell diodes, and performing column-decode using DTL logic.
15. For future generations, the operating current will be in nano amp range. Low Vt sbd (0.3V) and lower Vtn, Vtp (0.3V) will be attractive for further voltage scale down in the future generation.
16. For future SOI generations, DSRAM cells may be implemented with PN junction diodes.
17. The 4T and 2-diode SRAM configuration may be applied to GaAs, and SOI technologies. The diodes can be PN junction types.

3.3 Further advantages of more generic DTL using the SBD with CFET, BiCFET, These circuit techniques may apply to other technologies such as BiFET, GaAs, SOI. And found applications in other product families such as DRAM, SRAM, CAM, PLD, Flash, Switch, ATM, Router, Microprocessors, and ASIC in general to form control logic functions. They are:

1. Used in a family of pulsed NAND gates, burns no dc power. Basic structure is Diode AND-tree followed by a CMOS inverter. The input fixed load is only the cathode stray capacitance, the noise margin is the diode-transistor Vt offset, the output stage is a CFET inverter, which is uniform and easy to balance for both up and down drive. So these NAND gates are having simplicity and exhibiting good load characteristics. It can form other complex logic functions.
2. Used as level shifters with N-FET or P-FET totem pole driver for word line driver.
3. Used as level shifter for the driver of the bit-line recovery circuit.
4. Used as clamp diodes to suppress PNPN latch-up action to eliminate the guard ring structures.
5. Used as ESD protection device in the input circuitry.
6. Used in the P-well/N-well to affect well biasing, It may be used to harden sub-threshold leakages or to lower the VT of NFET or PFET dynamically, by circuit means, in certain regions therefore to affect threshold voltages and circuit/device parameters for a given transistor.

Although the present invention has been described in accordance with the embodiments as shown, one of ordinary skills in the art will readily recognize that there could be variations to the embodiments and those variations would be within the spirit and scope of the present invention. Accordingly, many modifications may be made by one of ordinary skills in the art without departing from the spirit and scope of the above descriptions.

What is claimed is:

1. A method of making a Schottky barrier diode (SBD), utilizing an anode contact and a cathode contact, and that the cathode contact may be shared with an NFET source/drain, the cathode body series resistance being with a substrate bulk; the method comprising the sequential steps of:

(a) applying a N-type light implant to prepare a surface donor impurity concentration in all of the NFET and SBD contact areas to the level around 1.0–5.0 E16 atoms/cm$^3$,
    (b) blocking out the anode area by a photo-resist;
    (c) implanting with N++ donor impurity concentration to the level of about 1.0E 20 atom/cm$^3$ for all other contacts except the anode-contact; and
    (d) providing a low barrier metal deposition to provide the SBD.

2. The method of claim 1 which includes the steps of:

(e) providing an optional N+ implant to lower the SBD cathode series resistance in the bulk area.

3. The method of claim 1 which includes the steps of:

(f) removing photo-resist;
    (g) providing the low barrier metal deposition;
    (h) performing a first thermal treatment;
    (i) etching to keep the barrier metal silicide;
    (j) depositing a plurality of layers of TiW;
    (k) performing a second thermal treatment; and
    (k) providing standard wiring thin-film processes.

4. The method of claim 3 which provides barrier deposition and the first and second thermal treatment at a temperature range about 450–550° C.

5. The method of claim 4 wherein the preferred contact metal layers are any of Titanium Tungsten (TiW) or Platinum (Pt).

6. The method of claim 1 which includes the step of (e) growing a P-epitaxial layer over an N diffusion region in the substrate bulk.

7. The method of claim 3 wherein the low barrier deposition is provided at approximately 250°.

* * * * *